(12) United States Patent
Jeong et al.

(10) Patent No.: US 11,393,519 B2
(45) Date of Patent: Jul. 19, 2022

(54) SEMICONDUCTOR MEMORY DEVICES AND METHODS OF OPERATING THE SEMICONDUCTOR MEMORY DEVICES

(71) Applicant: SAMSUNG ELECTRONICS CO., LTD., Suwon-si (KR)

(72) Inventors: Yunkyeong Jeong, Seoul (KR); Chulhwan Choo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 138 days.

(21) Appl. No.: 16/901,125

(22) Filed: Jun. 15, 2020

(65) Prior Publication Data

US 2021/0158861 A1 May 27, 2021

(30) Foreign Application Priority Data

Nov. 25, 2019 (KR) .................. 10-2019-0151829

(51) Int. Cl.
| | |
|---|---|
| *G06F 11/10* | (2006.01) |
| *G11C 29/52* | (2006.01) |
| *G11C 11/16* | (2006.01) |
| *G11C 11/406* | (2006.01) |
| *H01L 25/065* | (2006.01) |

(52) U.S. Cl.
CPC .... *G11C 11/40611* (2013.01); *G06F 11/1068* (2013.01); *G11C 11/40615* (2013.01); *H01L 25/0657* (2013.01); *H01L 2225/06541* (2013.01)

(58) Field of Classification Search
CPC ........... H01L 2225/06541; H01L 25/18; H01L 25/0657; G11C 11/40611; G11C 11/40615; G11C 11/406; G11C 2211/4062; G06F 11/1068; G06F 11/1048
See application file for complete search history.

(56) References Cited

U.S. PATENT DOCUMENTS

| | | |
|---|---|---|
| 6,735,726 B2 | 5/2004 | Muranaka |
| 7,477,563 B2 | 1/2009 | Kang et al. |
| 9,087,613 B2 | 7/2015 | Sohn et al. |

(Continued)

FOREIGN PATENT DOCUMENTS

| | | |
|---|---|---|
| KR | 1020140050975 | 4/2014 |
| KR | 10-1773660 | 9/2017 |

*Primary Examiner* — Guy J Lamarre
(74) *Attorney, Agent, or Firm* — F. Chau & Associates, LLC

(57) ABSTRACT

The present disclosure relates to a semiconductor memory device. The semiconductor memory device includes memory cell array, error correction code (ECC) engine, refresh control circuit and control logic circuit. The memory cell array includes memory cell rows. The refresh control circuit performs a refresh operation on the memory cell rows. The control logic circuit controls the ECC engine such that the ECC engine generates an error generation signal by performing ECC decoding on sub-pages in at least one first memory cell row during a read operation. The control logic circuit compares an error occurrence count of the first memory cell row with a threshold value and provides the refresh control circuit with a first address of the first memory cell row as an error address based on the comparison. The refresh control circuit increases a number of refresh operations performed in the first memory cell row during a refresh period.

20 Claims, 18 Drawing Sheets

(56) References Cited

U.S. PATENT DOCUMENTS

| | | |
|---|---|---|
| 9,659,669 B2 | 5/2017 | Sohn et al. |
| 9,685,217 B2 | 6/2017 | Romanovskyy et al. |
| 9,831,003 B2 | 11/2017 | Sohn et al. |
| 9,953,725 B2 | 4/2018 | Ryu et al. |
| 10,347,355 B2 | 7/2019 | Sohn et al. |
| 10,372,544 B2 | 8/2019 | Ishikawa |
| 10,614,906 B2 * | 4/2020 | Ryu .................. G11C 29/42 |
| 2007/0079218 A1 * | 4/2007 | Nagai ................ G06F 11/106 |
| | | 714/763 |
| 2008/0126893 A1 * | 5/2008 | Harrand .................. G11C 7/04 |
| | | 714/719 |
| 2015/0016204 A1 * | 1/2015 | Dong .............. G11C 11/40618 |
| | | 365/222 |
| 2016/0133314 A1 * | 5/2016 | Hwang ............ G11C 11/40611 |
| | | 365/189.02 |
| 2016/0350178 A1 * | 12/2016 | Lien .................. G11C 13/0004 |
| 2017/0139771 A1 * | 5/2017 | Chung .................. G06F 3/064 |
| 2017/0269989 A1 * | 9/2017 | Kim .................... G06F 11/073 |
| 2018/0342284 A1 | 11/2018 | Jin et al. |
| 2019/0130960 A1 | 5/2019 | Kim et al. |
| 2019/0189194 A1 * | 6/2019 | Kim ................ G11C 11/40615 |
| 2021/0158861 A1 * | 5/2021 | Jeong ................ G06F 11/1048 |

\* cited by examiner

510b

540

| | RNK | ADDINF (BGA,BA,RA) | ECNT | FCWCNT | FG |
|---|---|---|---|---|---|
| Idx1 | 2 | A | 2 | 2 | 0 |
| Idx2 | 1 | B | 4 | 3 | 0 |
| ⋮ | ⋮ | ⋮ | ⋮ | ⋮ | ⋮ |
| Idxu | 3 | X | 1 | 1 | 1 |

594

595  596  597  598  599

SEMICONDUCTOR MEMORY DEVICES AND METHODS OF OPERATING THE SEMICONDUCTOR MEMORY DEVICES

CROSS-REFERENCE TO RELATED APPLICATIONS

This application claims the benefit of priority under 35 USC § 119 to Korean Patent Application No. 10-2019-0151829, filed on Nov. 25, 2019, in the Korean Intellectual Property Office, the disclosure of which is incorporated by reference herein in its entirety.

BACKGROUND

The present disclosure relates to memory devices, and more particularly to semiconductor memory devices and methods of operating the same.

Random-access memory (RAM) is an example of a computer memory device used to store working (temporary) information. RAM devices are commonly found in devices such as laptops mobile phones. Dynamic RAM (DRAM) is a subset of RAM in which information can be stored and read on a chip regardless of physical location of the information.

Bit errors are bits of information that have been changed during the programming, storage, or reading processes due to external factors. Bit errors can be corrected using error correction codes (ECC). For example, an ECC may be used to correct bit errors by performing a calculation to detect an error in a bit, and if an error is detected, then attempting to correct the error.

As the size of DRAM devices becomes smaller (i.e., as electronic devices become smaller), bit error rates can increase. Therefore, there is a need in the art for a more robust ECC operation to compensate for smaller DRAM devices.

SUMMARY

Some example embodiments provide a semiconductor memory device capable of adjusting refresh using error information.

Some example embodiments provide a method of operating semiconductor memory device, capable of adjusting refresh using error information.

According to example embodiments, a semiconductor memory device includes a memory cell array, an error correction code (ECC) engine; a refresh control circuit configured to perform a refresh operation on the plurality of memory cell rows; and a control logic circuit configured to control the ECC engine based on a command and an address from an external memory controller, wherein the control logic circuit is configured to control the ECC engine such that the ECC engine generates an error generation signal by performing an ECC decoding operation on sub-pages in at least one first memory cell row of the memory cell rows during a read operation, wherein the control logic circuit is further configured to compare an error occurrence count of the first memory cell row with a threshold value and to provide the refresh control circuit with a first address of the first memory cell row as an error address based on the comparison, wherein the error occurrence count is generated based on the error generation signal, and wherein the refresh control circuit is configured to increase a number of refresh operations performed in the first memory cell row during a refresh period based on the error occurrence count.

According to example embodiments, a semiconductor memory device includes a memory cell array, a memory cell array including a plurality of memory cell rows, each of the plurality of memory cell rows including a plurality of volatile memory cells; an error correction code (ECC) engine; a refresh control circuit configured to perform a refresh operation on the plurality of memory cell rows; an error information register; and a control logic circuit configured to control the ECC engine based on a command and an address from an external memory controller, wherein the control logic circuit is configured to control the ECC engine such that the ECC engine generates an error generation signal by performing an ECC decoding operation on sub-pages in at least one first memory cell row of the memory cell rows during a read operation, wherein the control logic circuit is further configured to either compare error occurrence count of the first memory cell row with a threshold value and to provide the refresh control circuit with a first address of the first memory cell row as an error address based on the comparison, the error occurrence count being generated based on the error generation signal, or to record error information in the error information register during the read operation and is to provide the error address to the refresh control circuit by referring to the error information register, wherein the error information at least includes a number of error occurrences in the first memory cell row and a second memory cell row, and wherein the refresh control circuit is further configured to increase a number of refresh operations performed in the first memory cell row during a refresh period.

According to example embodiments, there is provided a method of operating a semiconductor memory device. The semiconductor memory device includes a memory cell array including a plurality of memory cell rows and each of the plurality of memory cell rows includes a plurality of volatile memory cells. According to the method, an error correction code (ECC) decoding is performed, by an ECC engine, on sub-pages in at least one first memory cell row of the memory cell rows during a read operation. Error occurrence of the at least one first memory cell is counted, by a control logic circuit based on a result of the ECC decoding. The error occurrence count of the first memory cell row is compared, by the control logic circuit, with a threshold value and a first address of the first memory cell row is provided to a refresh control circuit as an error address in response to the error occurrence count being equal to or greater that the threshold value. A number of refresh operations performed on the first memory cell row during a refresh period is increased by the refresh control circuit.

According to example embodiments, a method of operating a memory device includes performing an error correction code (ECC) operation on a portion of memory cells in the memory device; modifying a pattern of refresh operations for the portion of the memory cells based on the ECC operation; and performing a refresh operation on the portion of the memory cells based on the modified pattern of refresh operations. In some cases, the method includes identifying an error count based on the ECC operation; determining that the error count is equal to or greater than a threshold value; and increasing a number of refresh operations for the portion of the memory cells, where modifying the pattern of refresh operations is based on the increased number of refresh operations.

Accordingly, the semiconductor memory device may increase credibility by increasing a number of refresh operations performed on some memory cell rows designated by error addresses during a refresh period by using error information obtained by a result of ECC decoding on memory cell rows during a read operation.

BRIEF DESCRIPTION OF THE DRAWINGS

Example embodiments will be described below in more detail with reference to the accompanying drawings.

DETAILED DESCRIPTION

Figure 1:
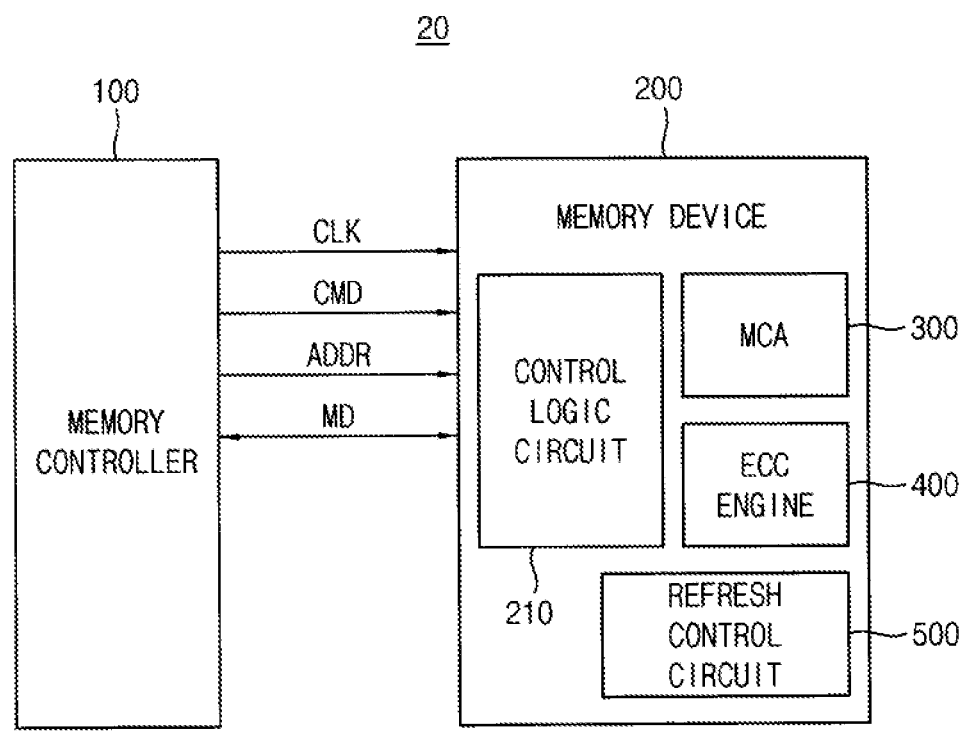
FIG. 1 is a block diagram illustrating a memory system according to example embodiments.

The present disclosure relates to a semiconductor memory device. More particularly, certain embodiments related to a semiconductor memory device with an error correcting code.

In some cases, a semiconductor memory device may refresh certain portions of the memory to preserve the stored information and increase the reliability of the memory. A memory refresh refers to the process of periodically reading information from an area of memory and rewriting the information to the same area without modification. Memory refresh may be a background maintenance process performed during the operation of dynamic random-access memory (DRAM).

In a DRAM memory, each bit of data may be stored as the presence or absence of an electric charge on a small capacitor. As time passes, the charge leaks away. Thus, without a memory refresh the stored data would. To prevent this data loss, a memory device may periodically read each cell and rewrite the stored data. The rewrite can restore the charge on the capacitor.

Each memory refresh cycle may be performed on memory cells in a particular area. According to embodiments of the present disclosure, different cells in the memory may be refreshed according to different periodicity. The refresh process may be conducted automatically in the background by the memory circuitry. In some cases, a memory cell may not be available for rewrite while the refresh cycle is occurring. Thus, it may be desirable to limit the refresh periodicity so that the overhead time associated with the memory refresh process is not large enough to significantly slow down memory operation.

According to at least one embodiment, a semiconductor memory device may include a memory cell array, an error correction code (ECC) engine, a refresh control circuit, and a control logic circuit. The memory cell array includes memory cell rows and the refresh control circuit performs a refresh operation on the memory cell rows. The ECC engine generates an error generation signal by performing an ECC decoding operation on sub-pages in at least one first memory cell row during a read operation. The control logic circuit controls the ECC engine based on a command and address from an external memory controller. The control logic circuit controls the ECC engine such that the ECC engine generates an error generation signal by performing an ECC decoding on sub-pages in at least one first memory cell row of the memory cell rows during a read operation.

The control logic circuit compares an error occurrence count of the first memory cell row to a threshold value and provides the refresh control circuit with a first address of the first memory cell row as an error address based on the comparison. The error occurrence count is generated based on the error generation signal. The refresh control circuit increases a quantity of refresh operations performed in the first memory cell row during a refresh period.

As a result, the semiconductor memory device may increase a number of refresh operations performed on some memory cell rows based on a result of ECC decoding operation.

Various example embodiments will be described more fully hereinafter with reference to the accompanying drawings, in which example embodiments are shown.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to a request from the host.

Additionally or alternatively, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or an LPDDR5 SDRAM.

The memory controller 100 transmits a clock signal CLK, a command CMD, and an address (signal) ADDR to the semiconductor memory device 200 and exchanges main data MD with the semiconductor memory device 200.

The semiconductor memory device 200 includes a memory cell array 300 that stores the main data MD and parity bits, an error correction code (ECC) engine 400, a control logic circuit 210, and a refresh control circuit 500.

The memory cell array 300 includes a plurality of memory cell rows. Each of the plurality of memory cell rows includes a plurality of volatile memory cells.

The ECC engine 400 may perform ECC encoding on a write data to be stored in a target memory cell row (a target page) of the memory cell array 300, and may perform ECC decoding on data read from the target page under the control of the control logic circuit 210. The ECC engine 400 may provide the control logic circuit 210 with information of an error bit in response to detecting an error bit. The detection of an error bit may be based on a result of the ECC decoding.

The control logic circuit 210 may control the ECC engine 400 such that the ECC engine 400 generates an error generation signal by performing ECC decoding on sub-pages in at least one first memory cell row of the memory cell rows during a read operation. The control logic circuit 210 may compare an error occurrence count of the first memory cell row with a threshold value and may provide the refresh control circuit 500 with a first address of the first memory cell row as an error address based on the comparison. The occurrence count may be generated based on the error generation signal.

The refresh control circuit 500 may perform a refresh operation on the plurality of memory cell rows, may include the first memory cell row in one or more weak pages of the memory cell array 300 and may increase a number of refresh operations performed in the one or more weak pages including the first memory cell row during a refresh period. A weak page may refer to a page in which errors are expected to occur with greater than a threshold frequency.

Figure 2:
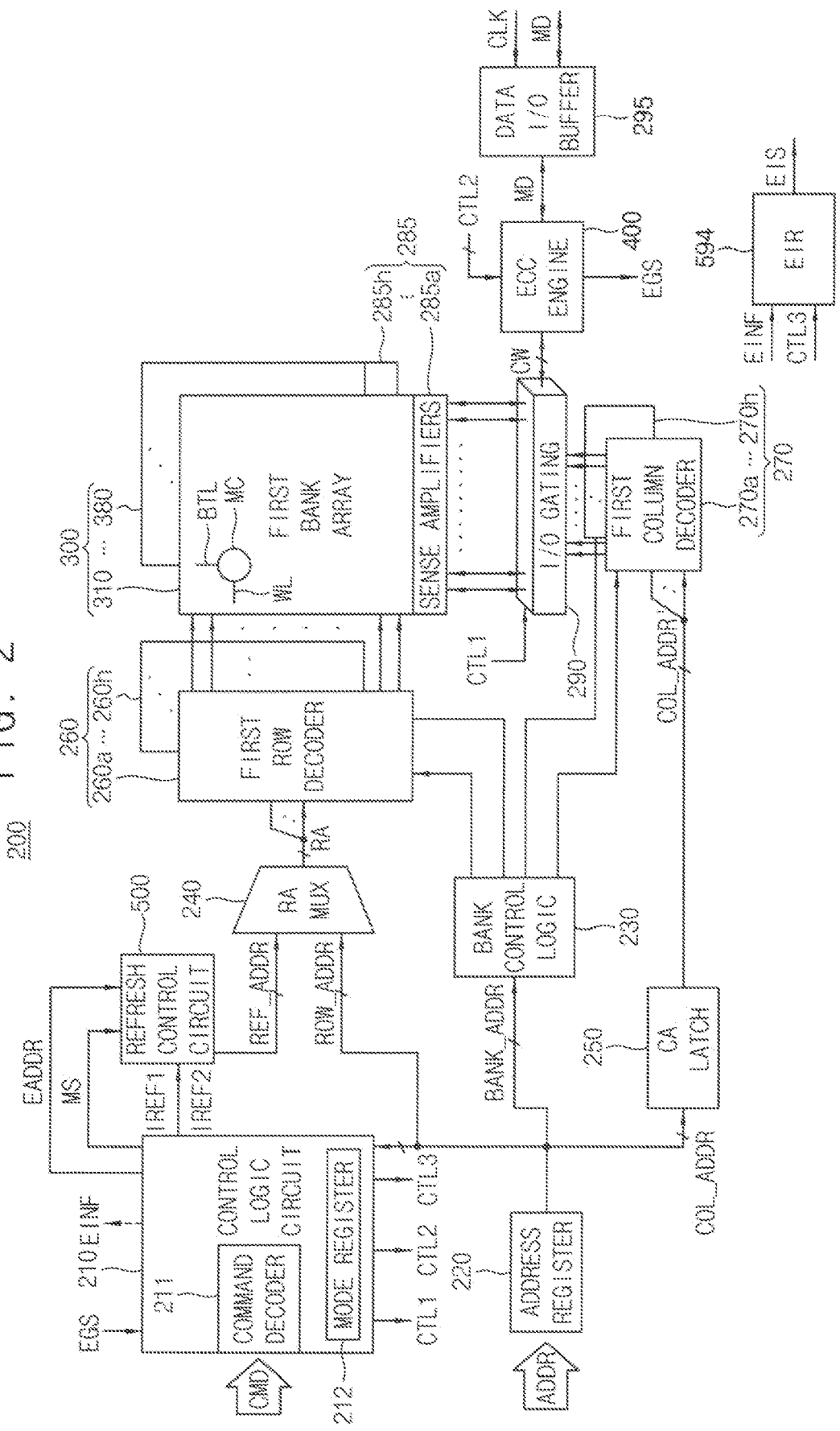
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200 includes the control logic circuit 210, an address register 220, a bank control logic 230, the refresh control circuit 500, a row address multiplexer 240, a column address latch 250, a row decoder 260, a column decoder 270, the memory cell array 300, a sense amplifier unit 285, an I/O gating circuit 290, the ECC engine 400, and a data I/O buffer 295. The semiconductor memory device 200 may further include an error information register 594.

The memory cell array 300 includes first through eighth bank arrays 310-380. The row decoder 260 includes first through eighth bank row decoders 260a-260h respectively coupled to the first through eighth bank arrays 310-380. The column decoder 270 includes first through eighth bank column decoders 270a-270h respectively coupled to the first through eighth bank arrays 310-380. The sense amplifier unit 285 includes first through eighth bank sense amplifiers 285a-285h respectively coupled to the first through eighth bank arrays 310-380.

The first through eighth bank arrays 310-380, the first through eighth bank row decoders 260a-260h, the first through eighth bank column decoders 270a-270h, and first through eighth bank sense amplifiers 285a-285h may form first through eighth banks. Each of the first through eighth bank arrays 310-380 includes a plurality of volatile memory cells MC formed at intersections of a plurality of word-lines WL and a plurality of bit-line BTL.

The address register 220 receives the address ADDR, wherein the address ADDR includes a bank address BANK_ADDR, a row address ROW_ADDR and a column address COL_ADDR from the memory controller 100. The address register 220 provides the received bank address BANK_ADDR to the bank control logic 230. Additionally or alternatively, The address register 220 provides the received row address ROW_ADDR to the row address multiplexer 240. The address register 220 also provides the received column address COL_ADDR to the column address latch 250.

The bank control logic 230 generates bank control signals in response to the bank address BANK_ADDR. One of the first through eighth bank row decoders 260a-260h corresponding to the bank address BANK_ADDR is activated in response to the bank control signals, and one of the first through eighth bank column decoders 270a-270h corresponding to the bank address BANK_ADDR is activated in response to the bank control signals.

The row address multiplexer 240 receives the row address ROW_ADDR from the address register 220 and receives a refresh row address REF_ADDR from the refresh control circuit 500. The row address multiplexer 240 selectively outputs the row address ROW_ADDR or the refresh row address REF_ADDR as a row address RA. The row address RA output from the row address multiplexer 240 is applied to the first through eighth bank row decoders 260a-260h.

The refresh control circuit 500 may output the refresh row address REF_ADDR that sequentially changes in response to a first refresh control signal IREF1 or a second refresh control signal IREF2 from the control logic circuit 210. The refresh control circuit 500 may store an error address EADDR from the control logic circuit 210 in a look-up table therein.

When the command CMD from the memory controller 100 corresponds to an auto-refresh command, the control logic circuit 210 may apply the first refresh control signal IREF1 to the refresh control circuit 500 whenever the control logic circuit 210 receives the auto-refresh command.

When the command CMD from the memory controller 100 corresponds to a self-refresh entry (SRE) command, the control logic circuit 210 may apply the second refresh control signal IREF2 to the refresh control circuit 245. As a result, the second refresh control signal IREF2 is activated from a time point when the control logic circuit 210 receives the self-refresh entry command to a time point when the control logic circuit 210 receives a self-refresh exit (SRX) command. The refresh control circuit 500 may sequentially increase or decrease the refresh row address REF_ADDR in response to receiving the first refresh control signal IREF1, or during the second refresh control signal IREF2 is activated. The control logic circuit 210 may provide the refresh control circuit 500 with a mode signal MS indicating a refresh mode based on the command CMD.

The activated one of the first through eighth bank row decoders 260a-260h, activated by the bank control logic 230, decodes the row address RA output from the row address multiplexer 240 and activates a word-line corresponding to the row address RA. For example, the activated bank row decoder applies a word-line driving voltage to the word-line corresponding to the row address RA.

The column address latch 250 receives the column address COL_ADDR from the address register 220 and temporarily stores the received column address COL_ADDR. In some embodiments, in burst mode, the column address latch 250 generates column addresses COL_ADDR' based on the received column address COL_ADDR. The column address latch 250 applies the temporarily stored or generated column address COL_ADDR' to the first through eighth bank column decoders 270a-270h.

The activated one of the first through eighth bank column decoders 270a-270h activates a sense amplifier corresponding to the bank address BANK_ADDR and the column address COL_ADDR' through the I/O gating circuit 290.

The I/O gating circuit 290 includes circuitry for gating input/output data. The I/O gating circuit 290 further includes input data mask logic, mad data latches for storing data output from the first through eighth bank arrays 310-380, and write drivers for writing data to the first through eighth bank arrays 310-380.

Codeword CW read from one bank array of the first through eighth bank arrays 310-380 may be sensed by a sense amplifier, where the sense amplifier may be coupled to the one bank array from which the data is to be read. The codeword CW is then stored in the read data latches. The codeword CW stored in the read data latches may be provided to the memory controller 100 via the data I/O buffer 295 after ECC decoding is performed on the codeword CW by the ECC engine 400.

The main data MD to be written in one bank array of the first through eighth bank arrays 310-380 may be provided to the data I/O buffer 295 from the memory controller 100. The main data MD may also be provided to the ECC engine 400 from the data VO buffer 295. The ECC engine 400 may perform an ECC encoding on the main data MD to generate parity bits. The ECC engine 400 may also provide the main data MD and the parity bits to the I/O gating circuit 290. The I/O gating circuit 290 may write the main data MD and the parity bits in a sub-page of a target page in one bank array through the write drivers.

The data I/O buffer 295 may provide the main data MD from the memory controller 100 to the ECC engine 400 in a write operation of the semiconductor memory device 200, based on the clock signal CLK. The data I/O buffer 295 may also provide the main data MD from the ECC engine 400 to the memory controller 100 in a read operation of the semiconductor memory device 200.

The ECC engine 400 performs an ECC decoding on a codeword read from a sub-page of the target page. The ECC engine 400 may also provide an error generation signal EGS to the control logic circuit 210, correcting at least one error bit when the at least one error bit is detected in the main data MD of the codeword in a read operation of the semiconductor memory device 200.

The control logic circuit 210 may count the error generation signal EGS by unit of memory cell row (a page). The control logic circuit 210 may then compare an error occurrence count of each of the memory cell rows to a threshold value and may provide the refresh control circuit 500 with a first address of at least one first memory cell row as an error address EADDR in response to the error occurrence count of the first memory cell row being equal to or greater than the threshold value.

In an example embodiment, the control logic circuit 210 may store, as an error information EINF in the error information register 594, a row address and a column address associated with a codeword in which the at least one error bit is detected.

The control logic circuit 210 may control operations of the semiconductor memory device 200. For example, the control logic circuit 210 may generate control signals for the semiconductor memory device 200 to perform a write operation or a read operation. The control logic circuit 210 includes a command decoder 211 to decode the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the IO gating circuit 290, a second control signal CTL2 to control the ECC engine 400, and a third control signal CTL3 to control the error information register 594.

The error information register 594 may provide (transmit) information associated with some of the error information EINF stored therein to the memory controller 100 as an error information signal EIS. The error information register 594 may transmit the error information signal EIS to the memory controller 100 via one of a dedicated pin or a data I/O pin in response to the third control signal CTL3.

Figure 3:
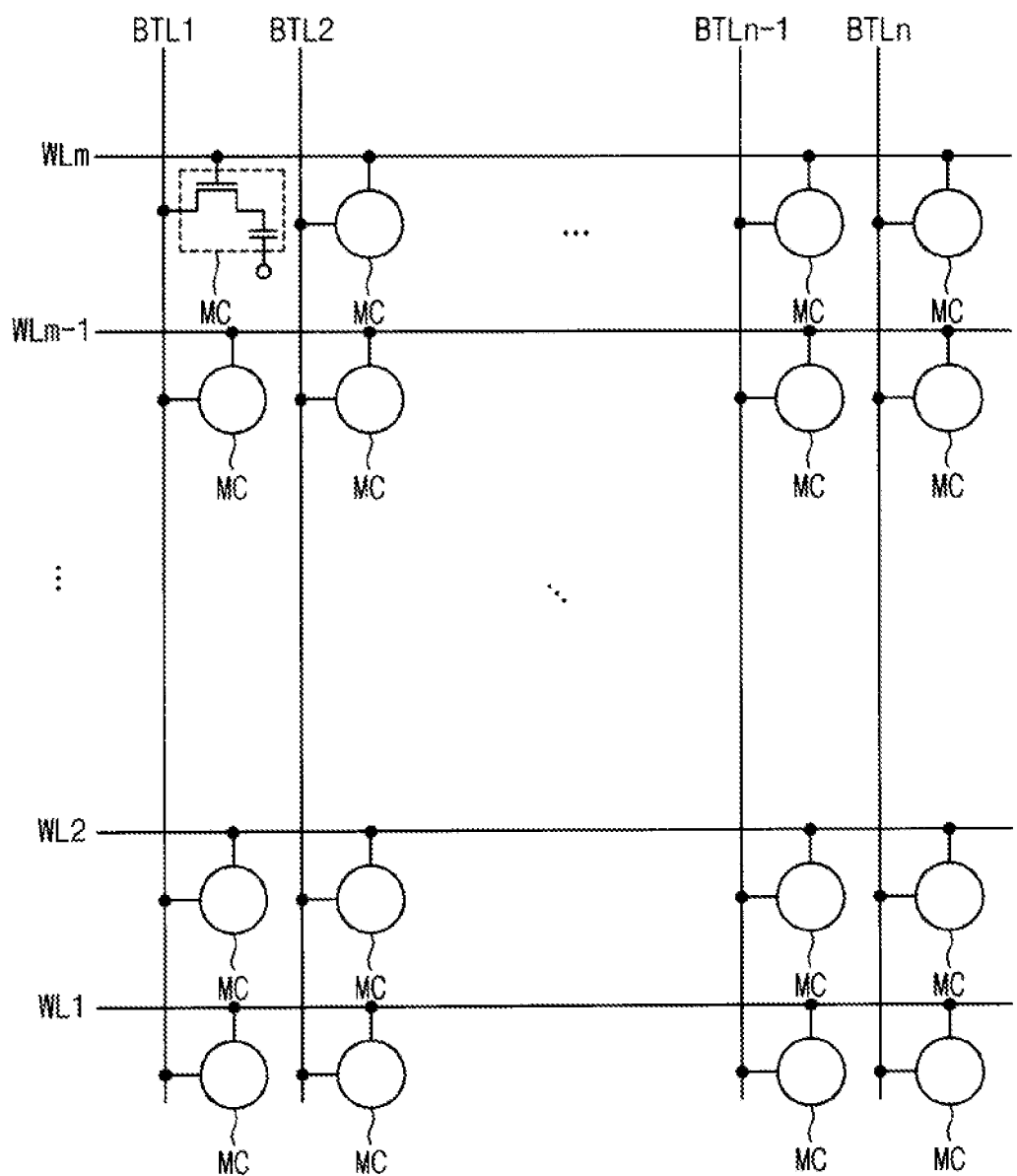
FIG. 3 illustrates an example of the first bank array in the semiconductor memory device of FIG. 2 according to example embodiments.

FIG. 3 illustrates an example of the first bank array in the semiconductor memory device of FIG. 2, according to example embodiments.

Referring to FIG. 3, the first bank array 310 includes a plurality of word-lines WL1-WLm (m is a natural number equal to or greater than two), a plurality of bit-lines BTL1-BTLn (n is a natural number equal to or greater than two), and a plurality of memory cells MCs disposed at intersections between the word-lines WL1-WLm and the bit-lines BTL1-BTLn. Each of the memory cells MCs may include a cell transistor coupled to each of the word-lines WL1-WLm, each of the bit-lines BTL1-BTLn, and a cell capacitor. Wherein the cell capacitor is coupled to the cell transistor.

Figure 4:
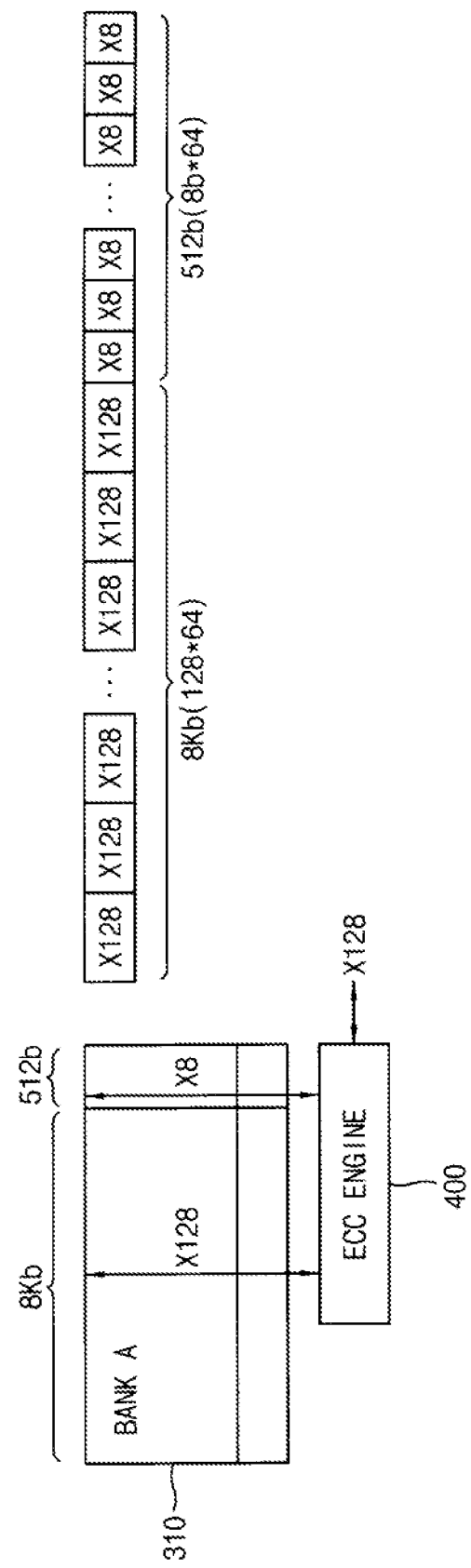
FIG. 4 illustrates an example of the first bank array in the semiconductor memory device of FIG. 2 according to example embodiments.

FIG. 4 illustrates a bank array and the ECC engine shown in the semiconductor memory device of FIG. 2.

Referring to FIG. 4, each page of the first bank array 310 has a size of 8 Kb, and each sub-page of the page has a size of 128 bits. Parity bits of 8 bits are stored for each sub-page. Data from each sub-page with a size of 128 bits and corresponding parity bits with a size of 8 bits are sequentially read and provided to the ECC engine 400.

Figure 5:
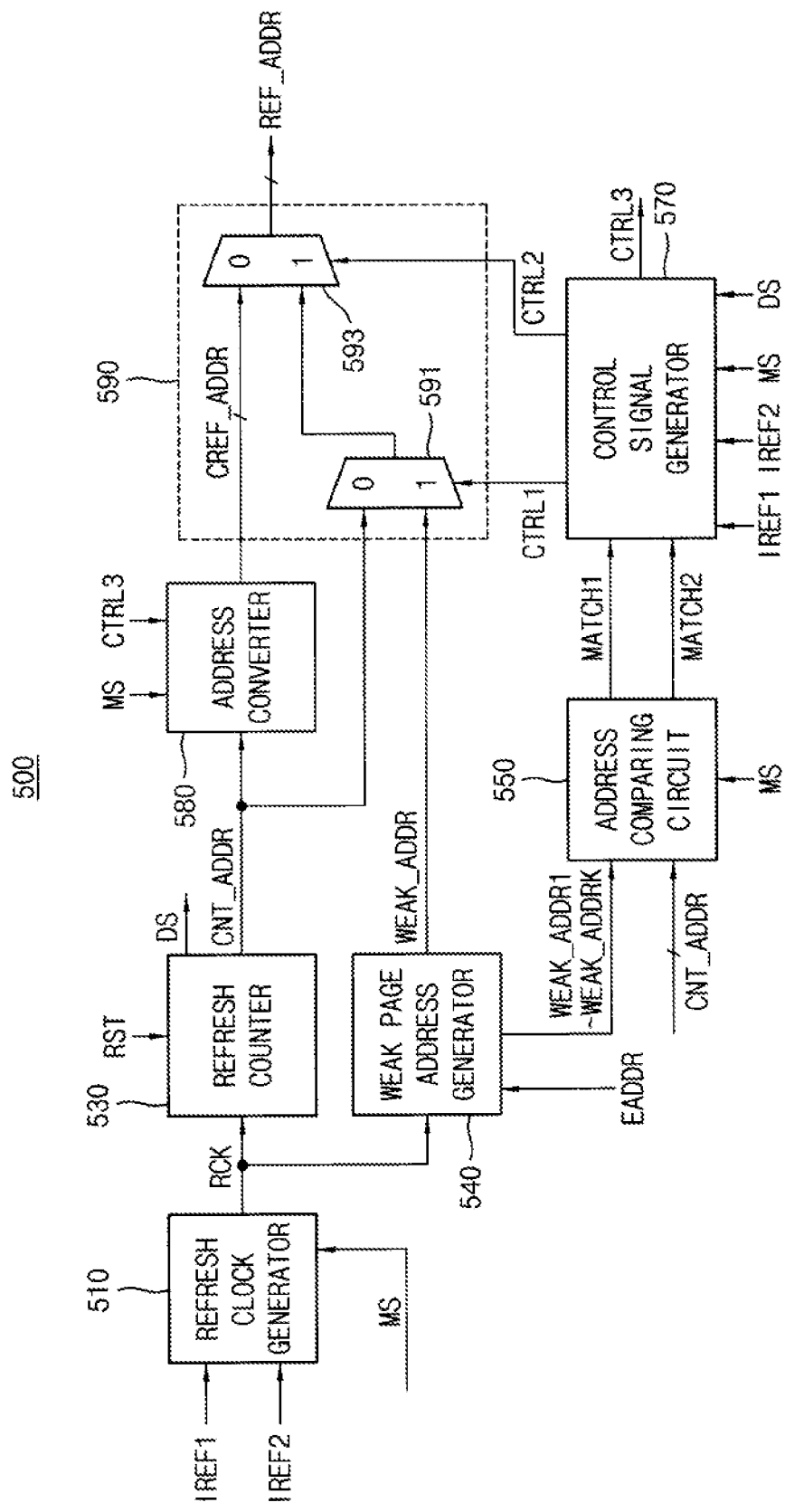
FIG. 5 is a block diagram illustrating an example of the refresh control circuit in the semiconductor memory device of FIG. 2 according to example embodiments.

FIG. 5 is a block diagram illustrating an example of the refresh control circuit in the semiconductor memory device of FIG. 2 according to example embodiments.

Referring to FIG. 5, the refresh control circuit 500 may include a refresh clock generator 510, a refresh address counter 530, a weak page address generator 540, an address comparing circuit 550, a control signal generator 570, an address converter 580, and a refresh address output circuit 590.

The refresh clock generator 510 may generate a refresh clock signal RCK based on the first refresh control signal IREF1, the second refresh control signal IREF2, and the mode signal MS. Additionally or alternatively, the first refresh control signal IREF1 may be associated with an auto-refresh mode based on the command from the memory controller 100. The second refresh control signal IREF2 may be associated with a self-refresh mode. In the auto-refresh mode, the refresh control circuit 500 may perform a normal refresh operation on the memory cell rows in the memory cell array 300 in response to a refresh command from the memory controller 100. In the self-refresh mode, the refresh control circuit 500 may perform the normal refresh operation on the memory cell rows in the memory cell array 300.

Additionally or alternatively, the mode signal MS may direct whether a weak refresh operation on one or more weak pages is performed in parallel with the normal refresh operation or sequentially after the normal refresh operation. For example, when the mode signal MS has a first logic level (logic high level), the refresh control circuit 500 may perform the weak refresh operation in parallel with the normal refresh operation (parallel refresh mode). When the mode signal MS has a second logic level (logic low level), the refresh control circuit 500 may perform the weak refresh operation after the normal refresh operation is completed (sequential refresh mode). The mode register 212 may provide the first refresh control signal IREF1 and the second refresh control signal IREF2, and the mode signal MS to the refresh control circuit 500.

The one or more weak pages include at least one weak cell whose data retention time is shorter than a data retention time of normal cells.

The refresh clock generator 510 may change a period of the refresh clock signal RCK in response to first refresh control signal IREF1 and the second refresh control signal IREF2 and the mode signal MS. For example, when the first refresh control signal IREF1 designates the auto-refresh mode or the self-refresh mode and the mode signal MS indicates the sequential refresh mode, the refresh clock generator 510 may decrease a period of the refresh clock signal RCK.

When the period of the refresh clock signal RCK is decreased, a refresh interval is also decreased. Therefore, the refresh control circuit 500 may perform the normal refresh operation and the weak refresh operation sequentially within a refresh period defined in the specification of the semiconductor memory device 200. For example, the weak pages are refreshed at least two times during the refresh period.

The refresh address counter 530 may generate a counting address CNT_ADDR designating respective memory cell rows by performing a counting operation at the period of the refresh clock signal RCK. The refresh address counter 530 may output a done signal DS upon the refresh address counter 530 outputting a maximum value of the counting address CNT_ADDR.

The control logic circuit 210 may provide a reset signal RST to the refresh address counter 530 during a power-up sequence. The refresh address counter 530 may be reset to initialize the value of counting address CNT_ADDR in response to the reset signal RST. The weak page address generator 540 may store weak page addresses of the weak pages and may output a weak page address WEAK_ADDR. The weak page address generator 540 may store the error address EADDR as the weak page address WEAK_ADDR The address comparing circuit 550 is enabled when the mode signal MS has a first logic level, for example, when the mode signal MS indicates the parallel refresh mode. The address comparing circuit 550 may also compare each of the weak page addresses WEAK_ADDR1-WEAK_ADDRK, where K is a natural number greater than one, with the counting address CNT_ADDR to provide a first match signal MATCH1 and the second match signal MATCH2. When each bit of the counting address CNT_ADDR matches with each bit of one of the weak page addresses WEAK_ADDR1-WEAK_ADDRK, each of the first and second match signals MATCH1 and MATCH2 has a first logic level. When each bit of the counting address CNT_ADDR matches with each bit of one of the weak page addresses WEAK_ADDR1-WEAK_ADDRK except at least one bit, such as a most significant bit (MSB), the first match signal MATCH1 has a second logic level and the second match signal MATCH2 has a first logic level.

The control signal generator 570 may generate a plurality of control signals CTRL1, CTRL2, and CTRL3 based on the first match signal MATCH1, the second match signal MATCH2, the first refresh control signal IREF1, the second refresh control signal IREF2, the mode signal MS, and the done signal DS. The control signal generator 570 may output the first control signal CTRL1 and the second control signal CTRL2 to the refresh address output circuit 590 and may output the third control signal CTRL3 to the address converter 580.

When the first refresh control signal IREF1 indicates the auto-refresh mode or the self-refresh mode and the mode signal MS indicates the parallel refresh mode of the weak refresh operation, the control signal generator 570 may output the second control signal CTRL2 and the third control signal CTRL3 with a second logic level. When the first refresh control signal IREF indicates the auto-refresh mode or the self-refresh mode and the mode signal MS indicates the sequential refresh mode of the weak refresh operation, the control signal generator 570 may output the second control signal CTRL2 with a first logic level and may output the first control signal CTRL1 with a second logic level. Then, the control signal generator 570 may output the first control signal CTRL1 with a transition to a first logic level in response to the done signal DS transitioning to a first logic level.

The address converter 580 is activated when the mode signal MS indicates the parallel refresh mode and may perform do-not-care processing on at least one bit of the counting address CNT_ADDR such as MSB of the counting address CNT_ADDR in response to the third control signal CTRL3 to output a changed refresh row address CREF_ADDR. When the changed refresh row address CREF_ADDR is output as a refresh row address REF_ADDR, two memory cell rows corresponding to two page addresses whose MSB are different from each other are simultaneously enabled. The two memory cell rows corresponding to two page addresses whose MSB are different from each other belong to different memory blocks in the memory cell array 300, which do not share a sense amplifier.

The refresh address output circuit 590 may include a first multiplexer 591 and a second multiplexer 593. The first multiplexer 591 may select one of the counting address CNT_ADDR and the weak page address WEAK_ADDR (WEAK_ADDR1-WEAK_ADDRK) in response to the first control signal CTRL1. The second multiplexer 593 may select one of the changed refresh row address CREF_ADDR and an output of the first multiplexer 591 to output the refresh row address REF_ADDR in response to the second control signal CTRL2.

Figure 6:
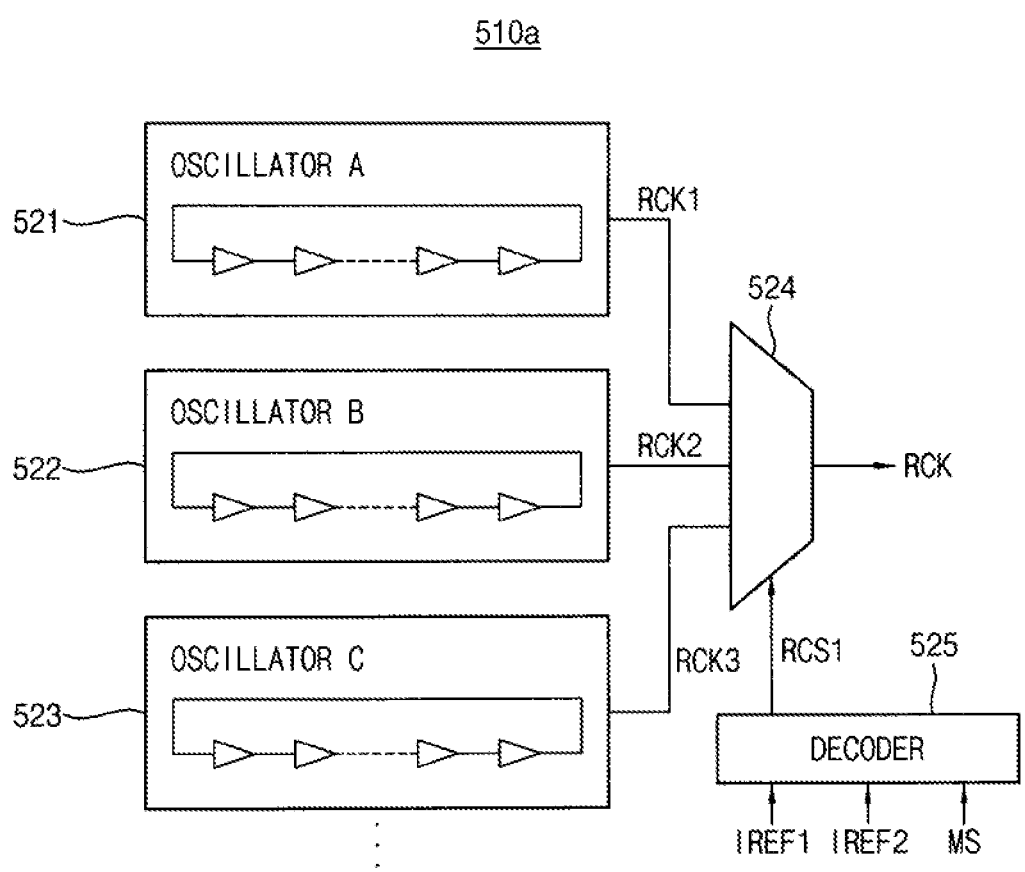
FIG. 6 is a circuit diagram illustrating an example of the refresh clock generator in the refresh control circuit of FIG. 5 according to example embodiments.

FIG. 6 is a circuit diagram illustrating an example of the refresh clock generator in the refresh control circuit of FIG. 5 according to example embodiments.

Referring to FIG. 6, a refresh clock generator 510a may include a plurality of oscillator 521, 522 and 523, a multiplexer 524, and a decoder 525. The decoder 525 may decode the refresh control signal IREF1, the second refresh control signal IREF2, and the mode signal MS to output a clock control signal RCS1. The oscillators 521, 522, and 523 generate refresh clock signals RCK1, RCK2, and RCK3 with different periods. The multiplexer 524 selects one of the refresh clock signals RCK1, RCK2, and RCK3 to provide the refresh clock signal RCK in response to the clock control signal RCS1.

Figure 7:
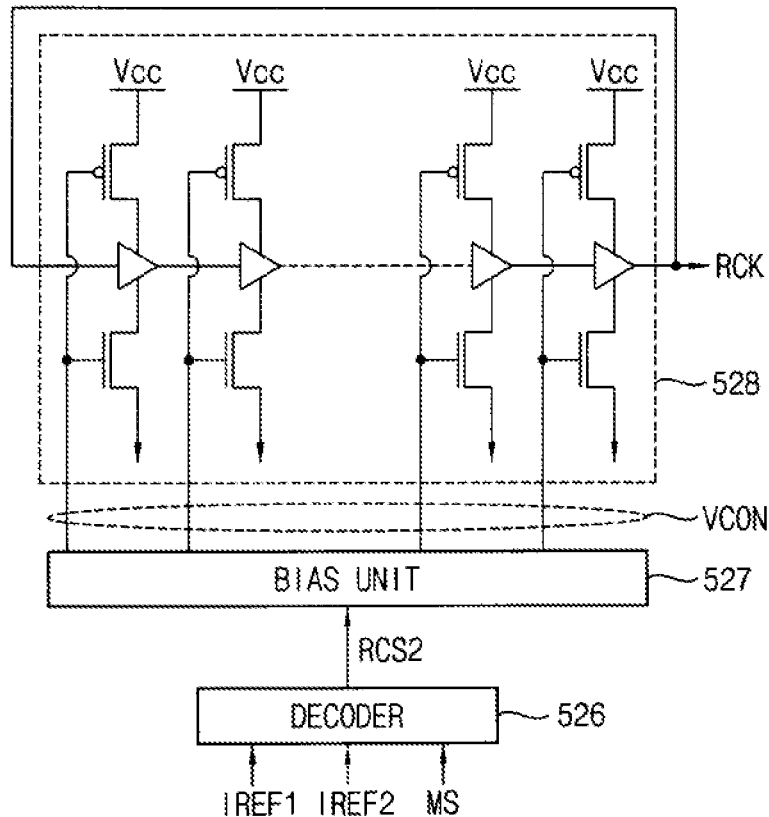
FIG. 7 is a circuit diagram illustrating another example of the refresh clock generator in the refresh control circuit of FIG. 5 according to example embodiments.

FIG. 7 is a circuit diagram illustrating another example of the refresh clock generator in the refresh control circuit of FIG. 5 according to example embodiments.

Referring to FIG. 6, a refresh clock generator 510b may include a decoder 526, a bias unit 527, and an oscillator 528. The decoder 526 may decode the first refresh control signal IREF1, the second refresh control signal IREF2, and the mode signal MS to output a clock control signal RCS2. The bias unit 527 generates a control voltage VCON in response to the clock control signal RCS2. The oscillator 528 generates the refresh clock signal RCK with a variable period, according to the control voltage VCON.

Figure 8:
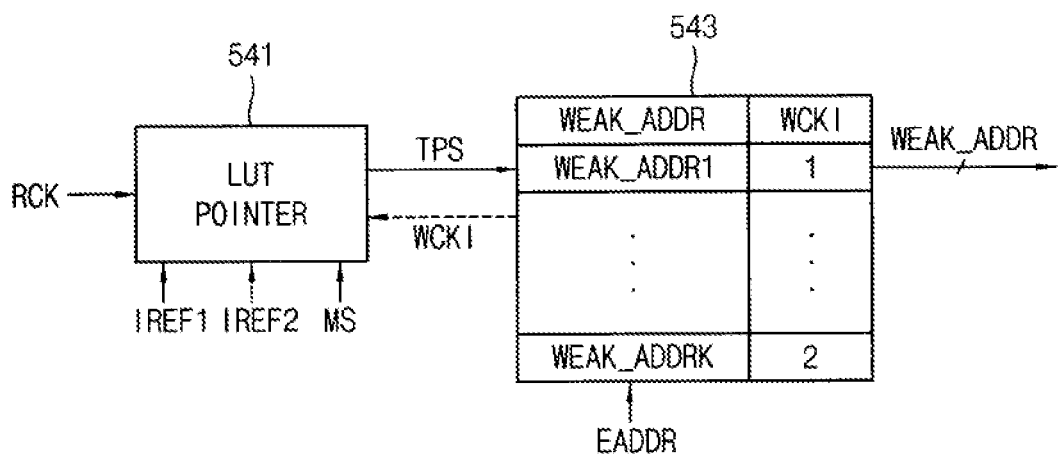
FIG. 8 illustrates the weak address generator in the refresh control circuit of FIG. 5 according to example embodiments.

FIG. 8 illustrates the weak address generator in the refresh control circuit of FIG. 5 according to example embodiments.

Referring to FIG. 8, the weak address generator 540 may include a look-up table (LUT) pointer 541 and an LUT 543.

The LUT pointer 541 generates a table pointing signal TPS indicating increasing table addresses of the LUT 543 based on the refresh control signal IREF1.*the* second refresh control signal IREF2 and the mode signal MS and delays providing the table pointing signal TPS to the LUT 543 by wait clocks indicated by the wait clock information WCKI. The LUT pointer 541 provides the table pointing signal TPS to the LUT 543.

The LUT 543 may store the weak addresses WEAK_ADDR1-WEAK_ADDRK of the memory cell array 300 according to order as the addresses increase. Additionally or alternatively, LUT 543 may store the error address EADDR as a portion of the weak addresses WEAK_ADDR1-WEAK_ADDRK. The LUT 543 may store the wait clock information WCKI for designating output timing of the weak address WEAK_ADDR.

The LUT pointer 541 may delay providing the table pointing signal TPS to the LUT 543 by wait clocks, indicated by the wait clock information WCKI, or output the table pointing signal TPS to the LUT 543 in synchronization with the refresh clock signal RCK based on the refresh control signal IREF1, the second refresh control signal IREF2 and the mode signal MS.

For example, when the mode signal MS indicates the parallel refresh mode, the LUT pointer 541 may delay providing the table pointing signal TPS to the LUT 543 by wait clocks indicated by the wait clock information WCKI. For example, when the mode signal MS indicates the sequential refresh mode, the LUT pointer 541 may output the table pointing signal TPS to the LUT 543 in synchronization with the refresh clock signal RCK without regard to the wait clock information WCKI.

Figure 9:
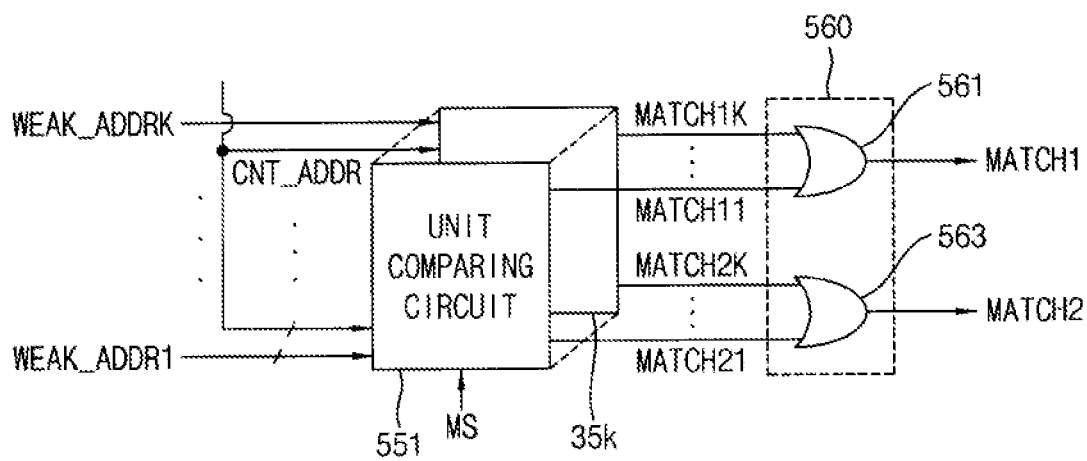
FIG. 9 illustrates the address comparing circuit shown in the refresh control circuit of FIG. 5 according to example embodiments.

FIG. 9 illustrates the address comparing circuit shown in the refresh control circuit of FIG. 5 according to example embodiments.

Figure 10:
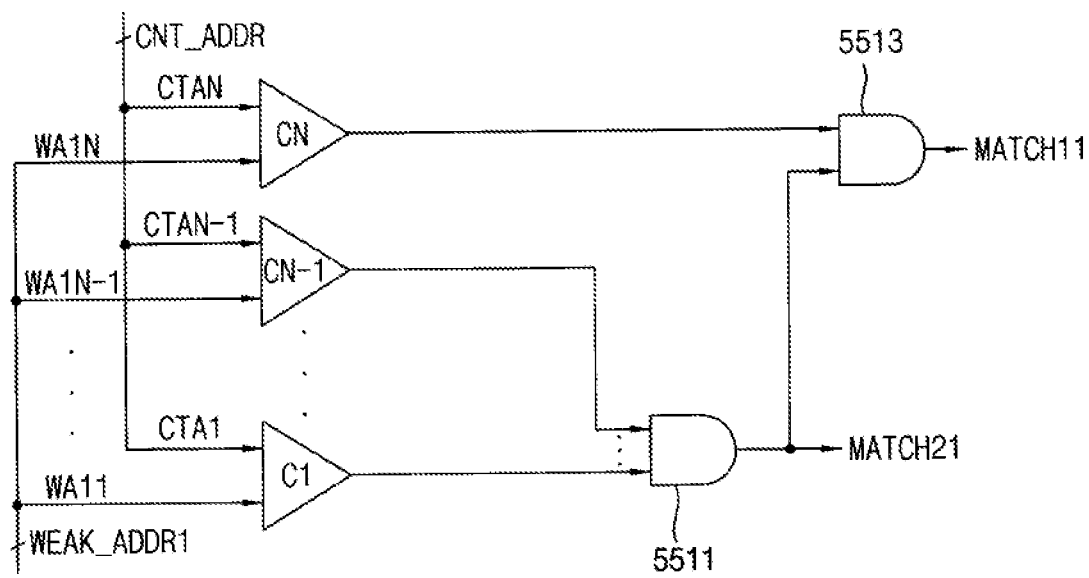
FIG. 10 illustrates one of the unit comparing circuit shown in FIG. 9.

Referring to FIG. 10, the address comparing circuit 550 may include a plurality of unit comparing circuit 551-55K and an operation unit 560.

Each of the unit comparing circuits 551-55K may compare each of the weak page addresses WEAK_ADDR1-WEAK_ADDRK and the counting address CNT_ADDR to provide a plurality of first match signals MATCH1-MATCH1K and compare each of abbreviated weak page addresses and an abbreviated counting address to provide a plurality of second match signals MATCH21-MATCH2K. Each of the abbreviated weak page addresses may be obtained by omitting at least one bit, such as an MSB of each of the weak page addresses WEAK_ADDR-WEAK_ADDRK, and the abbreviated counting address may be obtained by omitting an MSB of the counting address CNT_ADDR.

The operation unit 560 provides the first match signal MATCH1 and the second match signal MATCH2 based on the first match signals MATCH11-MATCH1K and the second match signals MATCH21-MATCH2K respectively. The operation unit 560 may include OR gates 561 and 563. The OR gates 561 perform logical OR operation on the first match signals MATCH11-MATCH1K to provide the first match signal MATCH1, and the OR gate 563 performs logical OR operation on the second intermediate match signals MATCH21-MATCH2K to provide the second match signal MATCH2.

Therefore, when at least one of the weak page addresses WEAK_ADDR1-WEAK_ADDRK matches with the counting address CNT_ADDR, the first match signal MATCH1 is a first logic level. Additionally or alternatively, when at least one of the abbreviated weak page addresses matches the abbreviated counting address, the second match signal MATCH2 is a first logic level. For example, when at least one of the weak page addresses WEAK_ADDR1-WEAK_ADDRK with matches with the counting address CNT_ADDR in every bit, the first and second match signals MATCH1 and MATCH2 are first logic level. When each address bit of at least one of the weak page addresses WEAK_ADDR1-WEAK_ADDRK matches with each address bit of the counting address CNT_ADDR, except at least one bit (e.g., a most significant bit MSB) the first match signal MATCH1 is a second logic level and the second match signal MATCH2 is a first logic level.

FIG. 10 illustrates one of the unit comparing circuits shown in FIG. 9.

In FIG. 10, a configuration of the first unit comparing circuit 551 of the unit comparing circuit 551-55K in FIG. 9 is illustrated.

Referring to FIG. 10, the first unit comparing circuit 551 may include a plurality of comparators C1-CN and AND gates 5511 and 5513. The comparators C1-CN compare bits WA11-WA1N of the first weak page address WEAK_ADDR1 and bits CTA1-CTAN of the counting address CNT_ADDR respectively. The AND gate 5511 performs a logical AND operation on outputs of the comparators C1-CN-1 except for the output of the comparator CN that compares MSBs of the weak page address WEAK_ADDR1 and the counting address CNT_ADDR to provide the second match signal MATCH21. The AND gate 5513 performs logical AND operation on outputs of the AND gate 5511 and the comparator CN to provide the first match signal MATCH11.

Therefore, the first match signal MATCH11 is a first logic high level when each bit WA11-WA1N of the first weak page address WEAK_ADDR1 matches with corresponding bit CTA1-CTAN of the counting address CNT_ADDR. Additionally or alternatively, the second match signal MATCH21 is a first level when each bit WA11-WA1N-1 of the first weak page address WEAK_ADDR1, except MSB, matches with corresponding bit CTA1-CTAN-1 of the counting address CNT_ADDR, except MSB. For example, when the first match signal MATCH11 is a second logic level and the second match signal MATCH21 is a first logic level, the MSB of the counting address CNT_ADDR is different from the MSB of the first weak page address WEAK_ADDR1.

Figure 11:
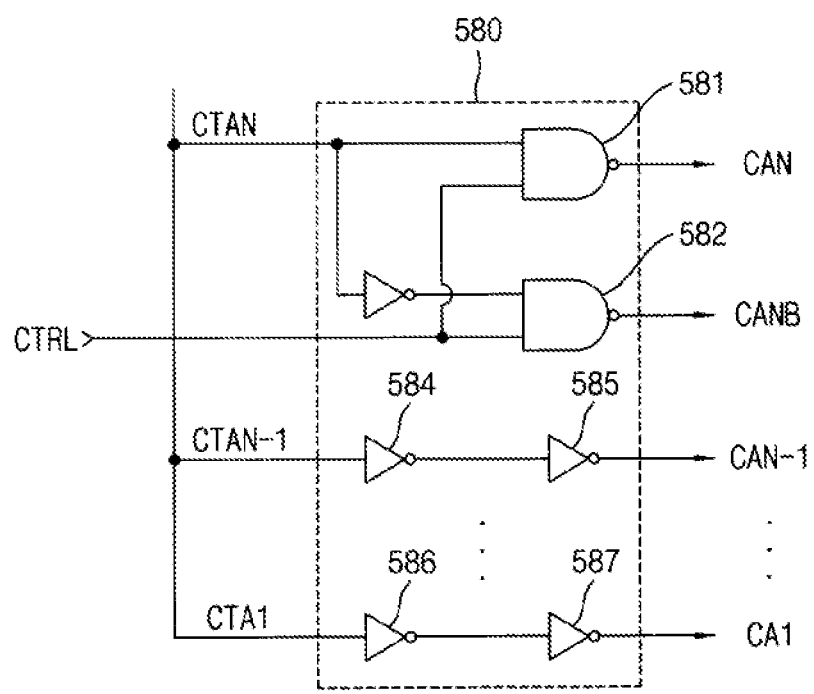
FIG. 11 illustrates the address converter in the refresh control circuit of FIG. 5 according to example embodiments.

FIG. 11 illustrates the address converter in the refresh control circuit of FIG. 5 according to example embodiments.

Referring to FIG. 11, the address converter 580 may include NAND gates 581 and 582, an inverter 5383, inverters 584 and 585 and inverters 586 and 587. The NAND gate 581 performs a logical NAND operation on MSB CTAN of the counting address CNT_ADDR and the third control signal CTRL3 to output an MSB CAN of the changed refresh row address CREF_ADDR.

The inverter 583 inverts the MSB CTAN of the counting address CNT_ADDR. The NAND gate 582 performs a logical NAND operation on an output of the inverter 583 and the third control signal CTRL3 to output an inverted version CANB of the MSB CAN of the changed refresh row address CREF_ADDR. The inverters 584 and 585 buffer a bit CTAN-1 of the counting address CNT_ADDR to output a bit CAN-1 of the changed refresh row address CREF_ADDR. The inverters 586 and 587 buffer a first bit CTA1 of the counting address CNT_ADDR to output a first bit CAI of the changed refresh row address CREF_ADDR.

When the third control signal CTRL3 has a second logic level, the NAND gates 581 and 582 may provide complementary outputs CAN and CANB with same logic levels without regard to a logic level of the MSB CTAN of the counting address CNT_ADDR. For example, when the MSB of the counting address CNT_ADDR CTAN is do-not-care processed, two memory cell rows may be selected from bits of the changed refresh row address CREF_ADDR, except for the MSB of the changed refresh row address CREF_ADDR. Therefore, when the third control signal CTRL3 has a second logic level, two memory cell rows may be simultaneously refreshed by one refresh row address REF_ADDR.

Figure 12:
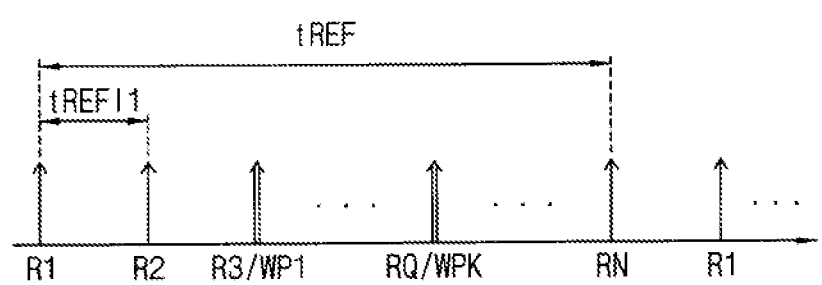
FIG. 12 illustrates that the normal refresh operation and the weak refresh operation are performed in parallel in the semiconductor memory device of FIG. 2.

FIG. 12 illustrates that the normal refresh operation and the weak refresh operation are performed in parallel in the semiconductor memory device of FIG. 2.

Referring to FIG. 12, when the semiconductor memory device 200 receives the command CMD from the memory controller 100, the weak refresh operation on the weak pages is performed in parallel with the normal refresh operation during the refresh period tREF. Memory cell rows corresponding to row addresses R1-RN are sequentially refreshed. When one or more memory cell rows corresponding to the row address R3 are refreshed, a weak page corresponding to a weak page address WP1 different from the row address R3 in the MSB is simultaneously refreshed.

Figure 13:
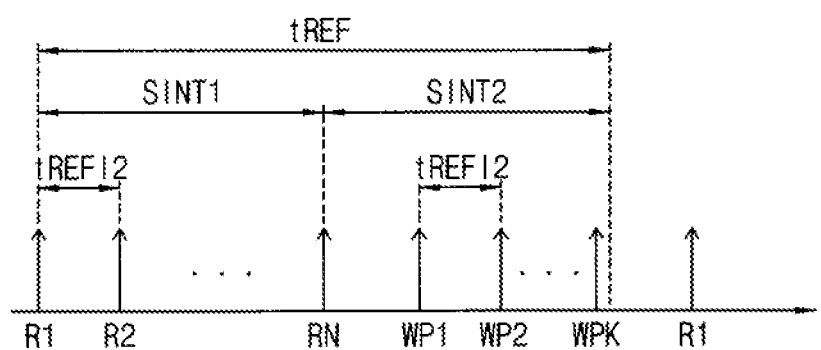
FIG. 13 illustrates that the normal refresh operation and the weak refresh operation are sequentially performed in the semiconductor memory device of FIG. 2.

Additionally or alternatively, when one or more memory cell rows corresponding to the row address RQ (Q is a natural number greater than 3 and smaller than N) are refreshed, a weak page corresponding to a weak page address WPK different from the row address RQ in the MSB is simultaneously refreshed. In FIG. 13, the memory cell rows corresponding to the row addresses R1-RN may be sequentially refreshed according to a first refresh interval tREFI1 within the refresh period tREF.

FIG. 13 illustrates that the normal refresh operation and the weak refresh operation are sequentially performed in the semiconductor memory device of FIG. 2.

Referring to FIG. 13, in response to the command CMD from the memory controller 100, the weak refresh operation on the weak pages is performed after the normal refresh operation. Memory cell rows corresponding to row addresses R1-RN are sequentially refreshed according to a second refresh interval tREFI2 during a first sub interval SINT1 within the refresh period tREF. The weak pages WP1-WPK are sequentially refreshed according to the second refresh interval tREFI2 during a second sub interval SINT2 within the refresh period tREF. In the case of FIG. 13, the refresh clock generator 510 may decrease the period of the refresh clock signal RCK, for example, by a half when compared with the case of FIG. 12.

Figure 14:
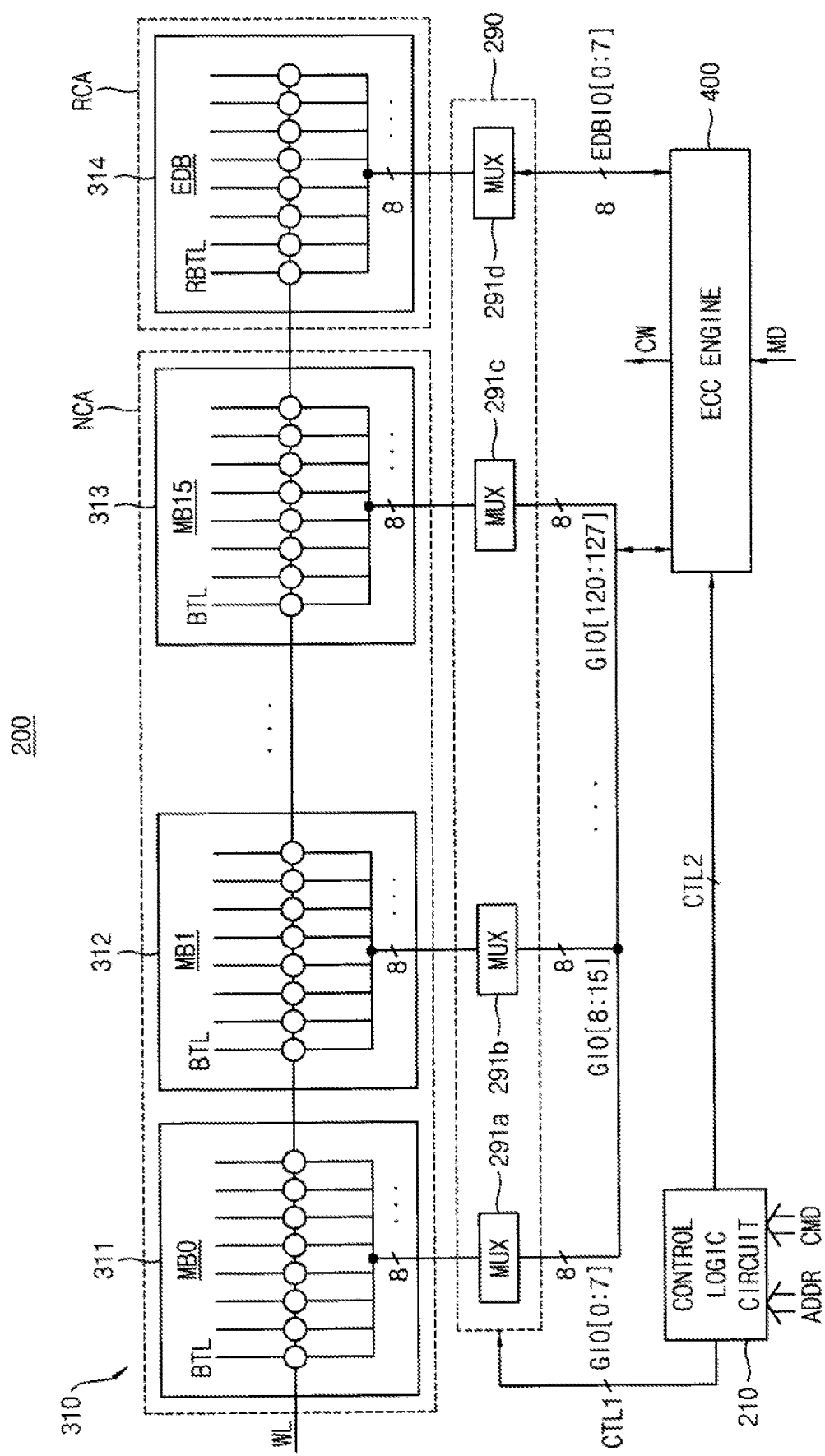
FIG. 14 illustrates a portion of the semiconductor memory device of FIG. 2 in a write operation.

FIG. 14 illustrates a portion of the semiconductor memory device of FIG. 2 in a write operation.

In FIG. 14, the control logic circuit 210, the first bank array 310, the I/O gating circuit 290, and the ECC engine 400 are illustrated.

Referring to FIG. 14, the first bank array 310 includes a normal cell array NCA and a redundancy cell array RCA.

The normal cell array NCA includes a plurality of first memory blocks MB0-MB15, i.e., 311-313, and the redundancy cell array RCA includes at least a second memory block 314. The first memory blocks 311-313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311-313, the second memory block 314 is also referred to as an EDB block. In each of the first memory blocks 311-313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 includes a plurality of switching circuits 291a-291d respectively connected to the first memory blocks 311-313 and the second memory block 314. In the semiconductor memory device 200, bit-lines corresponding to data of a burst length (BL) may be simultaneously accessed to support the BL indicating the maximum number of column positions that may be accessible. For example, the BL may be set to 8.

The ECC engine 400 may be connected to the switching circuits 291a-291d through first data lines GIO [0:127] and second data lines EDBIO [0:7]. The control logic circuit 210 may receive the command CMD and the address ADDR and may decode the command CMD to generate the first control signal CTL1 for controlling the switching circuits 291a-291d and the second control signal CTL2 for controlling the ECC engine 400.

When the command CMD is a write command, the control logic circuit 210 provides the second control signal CTL2 to the ECC engine 400 and the ECC engine 400 performs the ECC encoding on the main data MD to generate parity bits associated with the main data MD and provides the I/O gating circuit 290 with the codeword CW including the main data MD and the parity bits. The control logic circuit 210 provides the first control signal CTL1 to the I/O gating circuit 290 such that the codeword CW is to be stored in a sub-page of the target page in the first bank array 310.

Figure 15:
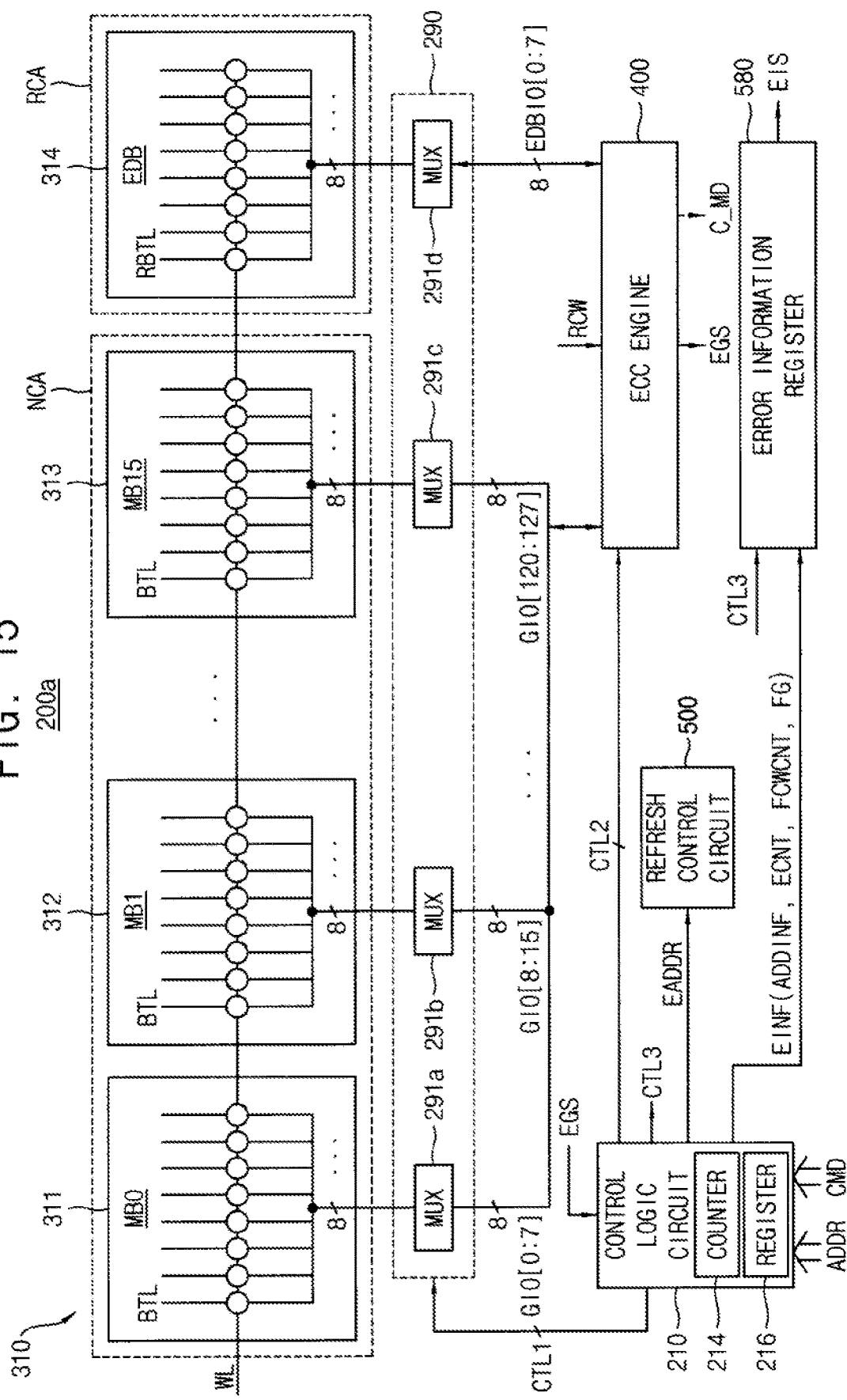
FIG. 15 illustrates the semiconductor memory device of FIG. 2 in a read operation.

FIG. 15 illustrates the semiconductor memory device of FIG. 2 in a read operation.

In FIG. 15, the control logic circuit 210, the first bank array 310, the I/O gating circuit 290, the ECC engine 400, the refresh control circuit 500 and the error information register 594 are illustrated.

Referring to FIG. 15, when the command CMD is a read command to designate a read operation, the control logic circuit 210 provides the first control signal CTL1 to the I/O gating circuit 290 such that a read codeword RCW stored in the sub-page of the target page in the first bank array 310 is provided to the ECC engine 400. Although FIG. 15 illustrates an example in which sense amplifiers are not disclosed, the first bank sense amplifiers 285a may be coupled between the first bank array 310 and the I/O gating circuit 290.

In the read operation, the ECC engine 400 performs a ECC decoding on the read codeword RCW read from each of the sub-pages, and the ECC engine 400 provides the error generation signal EGS to the control logic circuit 210 in response to detecting the error bit in the read codeword RCW. The control logic circuit 210 may include an error counter 214 and a register 216. The error counter 214 in the control logic circuit 210 counts the error generation signal EGS by unit of a page and compares the counted error generation signal (error occurrence count) with a threshold value stored in the register 216. The control logic circuit 210 may provide store the address of a first page in the LUT 543 in the refresh control circuit 500 as the error address EADDR if the error occurrence count of the first page is equal to or greater than the threshold value.

In some example embodiments, the ECC engine 400 may correct a correctable error bit in the read codeword RCW to output the corrected main data C_MD. In some example embodiments, the ECC engine 400 may correct a correctable error bit in the read codeword RCW to write back the corrected main data C_MD in a memory location in which the sub-page is stored.

In some example embodiments, the control logic circuit 210 may record the error information EINF in the error information register 594 based on the error generation signal EGS.

The error information EINF may include address information ADDINF, a number of error occurrences ECNT, a number of sub-pages including error bits FCWCNT, and flag information FG indicating whether the error information EINF is initially written in the error log register 594. The control logic circuit 210 controls the error information register 594 to transmit the error information EINF of the some memory cell rows or the sub-pages to the memory controller 100 as the error information signal EIS through the third control signal CTL3. The control logic circuit 210 may store the error address EADDR in the LUT 543 in the refresh control circuit 500 by referring to the error information register 594.

Figures 16, 17:
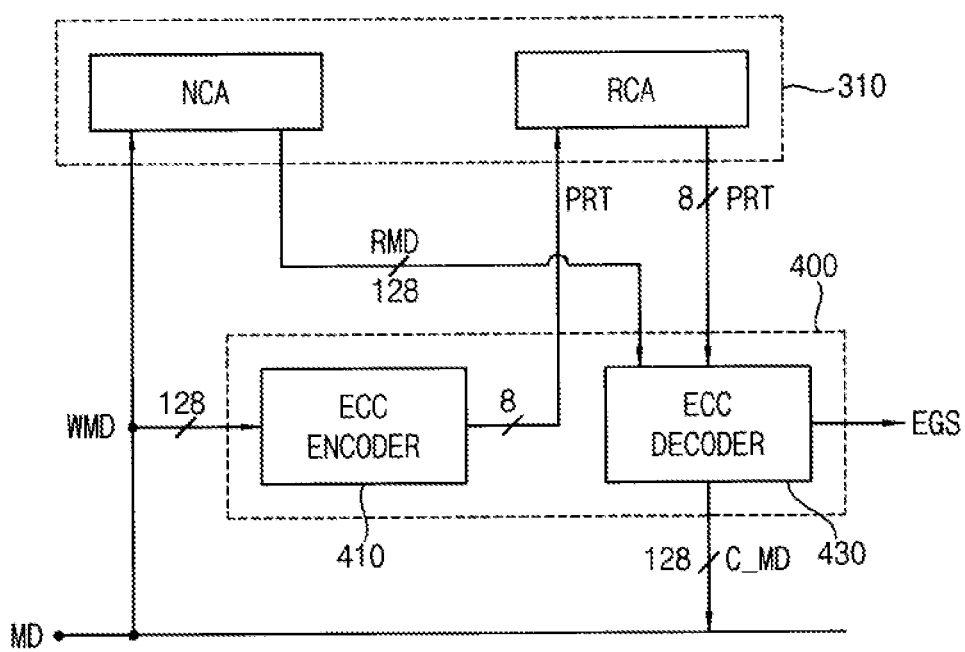
FIG. 16 illustrates the error information register in the semiconductor memory device of FIG. 15 according to example embodiments.
FIG. 17 is a block diagram illustrating an example of the ECC engine in the semiconductor memory device of FIG. 2 according to example embodiments.

FIG. 16 illustrates the error information register in the semiconductor memory device of FIG. 15 according to example embodiments.

Referring to FIG. 16, each of indexes (e.g., entries) Idx1, Indx2, ..., Idxu (u is a natural number greater than two) may include page error information on each of some pages of memory cell array 300. Each entry may correspond to one of the pages. The error information register 594 includes a plurality of columns 581, 582, 583, 584 and 585.

The first column 581 stores ranking information RNK on ranking of a number of error occurrences based on the number of the error occurrences of each of the some pages. An entry with ranking information RNK with a lowest value (e.g., 1) could be considered a highest rank and an entry with ranking information RNK with a highest value could be considered a lowest rank. For example, a first page associated with idx1 with 2 error occurrences during a given period could receive a RNK of 2. A second page associated with idx2 could receive a higher RNK of 1 when the second page has 4 error occurrences during the given period.

The second column 582 stores address information ADDINF of each of the some pages. In an example embodiment, the address information ADDINF includes at least one of a bank group address ('BGA'), a bank address ('BA'), and a row address ('RA'). While FIG. 2 illustrated a single group of bank arrays (e.g., 310-380), additional groups of bank arrays may be present. The bank group address may identify one of these groups. For example, if there is a first group of bank arrays includes bank arrays 310-380 and a second group of bank arrays, and the errors are occurring in the first group, the BGA would identify the first group. The bank address may identify one of the banks of the identified group. The row address may identify a page of the one bank.

The third column 583 stores a number of error occurrences ECNT of each of the some pages. For example, the error log register 594 of FIG. 16 illustrates the number of error occurrences ECNT for a page with address A is 2 and the number of error occurrences ECNT for a page with address B is 4.

The fourth column 584 stores a number of sub-pages FCWCNT including a bit error, of each of the some pages. For example, if a second page has 4 bit errors (ECNT=4), the second page has 64 sub-pages, but 3 of the 64 sub-pages have bit errors (e.g., sub-pages 1 and 12 each have 1 bit error and sub-page 43 has 2 bit errors), the entry of the second page would have a FCWCNT of 3.

The fifth column 585 stores the flag information FG of each of the some pages. The flag information FG indicates whether the error information of the corresponding page is initially written into the error log register 594. When the error information of the corresponding page is initially written into the error log register 594, the flag information FG has a first logic level (e.g., 0). In an embodiment, if the flag information FG of a page has a second logic level (e.g., 1), the page previously had error information.

The memory controller 100 may determine error handling policy of the memory cell row or the sub-page with uncorrectable errors based on the error information EINF in the error information register 594.

FIG. 17 is a block diagram illustrating an example of the ECC engine in the semiconductor memory device of FIG. 2 according to example embodiments.

Referring to FIG. 17, the ECC engine 400 includes an ECC encoder 410 and an ECC decoder 430.

The ECC encoder 410 may generate parity bits PRT associated with a write data WMD to be stored in the normal cell array NCA of the first bank array 310. The parity bits PRT may be stored in the redundancy cell array RCA of the first bank array 310.

The ECC decoder 430 may perform an ECC decoding on a read data RMD based on the read data RMD and the parity bits PRT read from the first bank array 310. When the read data RMD includes at least one error bit based on a result of the ECC decoding, the ECC decoder 430 provides the error generation signal EGS to the control logic circuit 210, and corrects the error bit in the read data RMD to output the corrected main data C_MD.

Figure 18:
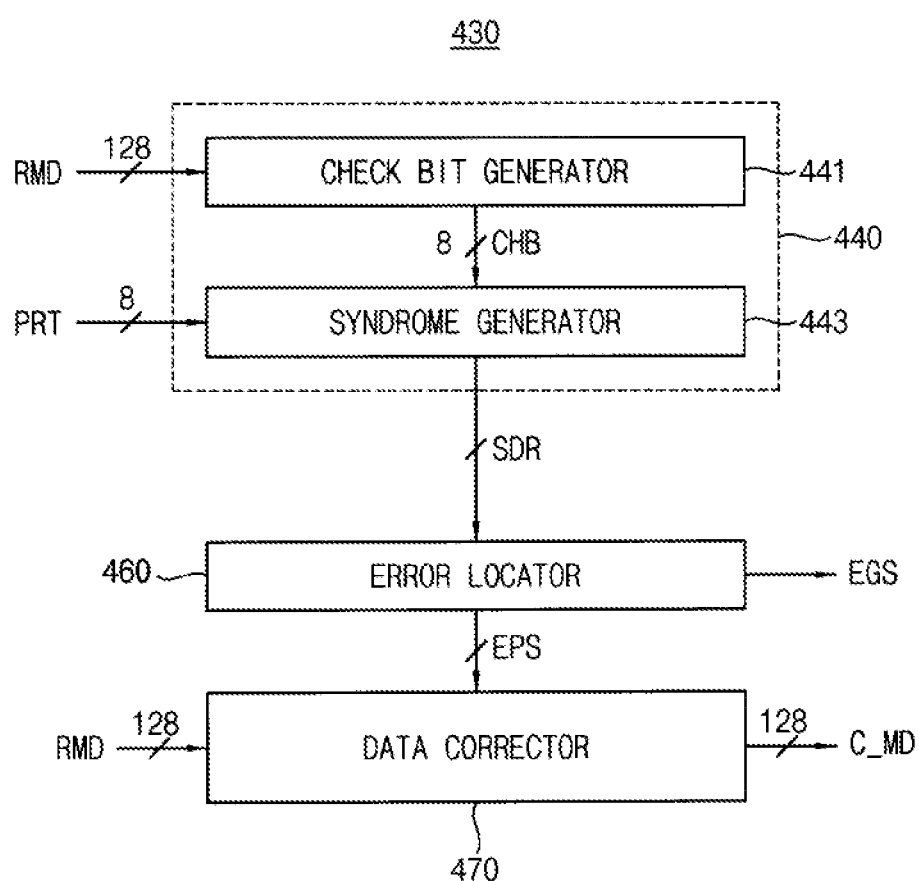
FIG. 18 illustrates an example of the ECC decoder in the ECC engine of FIG. 17 according to example embodiments.

FIG. 18 illustrates an example of the ECC decoder in the ECC engine of FIG. 17 according to example embodiments.

Referring to FIG. 18, the ECC decoder 430 may include a syndrome generation circuit 440, an error locator 460 and a data corrector 470. The syndrome generation circuit 440 may include a check bit generator 441 and a syndrome generator 443.

The check bit generator 441 generates check bits CHB based on the read data RMD by performing, an XOR array operation and the syndrome generator 443 generates a syndrome SDR by comparing corresponding bits of the parity bits PRT and the check bits CHB.

The error locator 460 generates an error position signal EPS indicating a position of an error bit in the read data RMD to provide the error positon signal EPS to the data corrector 470 by decoding the syndrome SDR when bits of the syndrome SDR are not 'zero'. Additionally or alternatively, when the read data RMD includes the error bit, the error locator 460 provides the error generation signal EGS to the control logic circuit 210.

The data corrector 470 receives the read data RMD, corrects the error bit in the read data RMD based on the error position signal EPS when the read data RMD includes the error bit and outputs the corrected main data C_MD.

Figure 19:
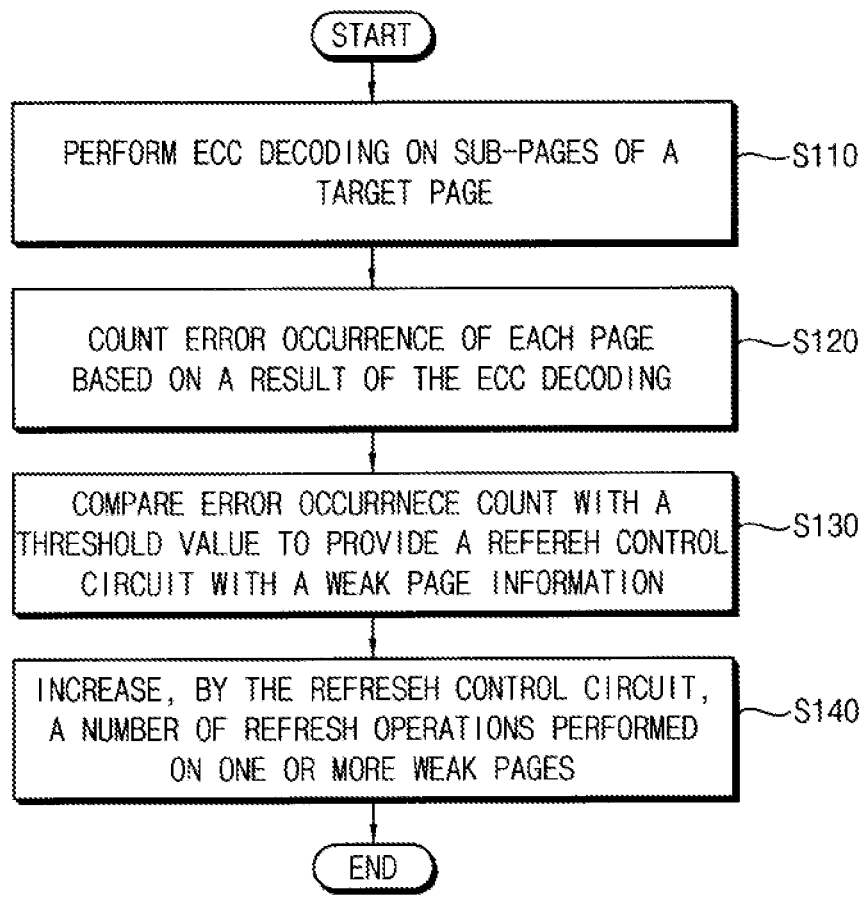
FIG. 19 is a flow chart illustrating a method of operating a semiconductor memory device according to example embodiments.

FIG. 19 is a flow chart illustrating a method of operating a semiconductor memory device according to example embodiments.

Referring to FIGS. 2 through 19, there is provided a method of operating a semiconductor memory device 200 which includes a memory cell array 300 with a plurality of memory cell rows and each of the memory cell rows includes a plurality of volatile memory cells.

In the method, the ECC engine 400 performs an ECC decoding sub-pages in at least one first memory cell row of the memory cell rows during a read operation (S110). When an error bit is detected as a result of the ECC decoding, the ECC engine 400 provides an error generation signal EGS to the control logic circuit 210 and the control logic circuit 210 records counts the error occurrence of the at least one first memory cell row (S120).

The control logic circuit 210 compares the error occurrence count of the first memory cell row with a threshold value to provide the refresh control circuit with 500 a first address of the first memory cell row as an error address in response to the error occurrence count being equal to or greater that the threshold value (S130). The refresh control circuit 500 increases a number of refresh operations performed on the first memory cell row during a refresh period (S140).

According to example embodiments, a method of operating a memory device includes performing an error correction code (ECC) operation on a portion of memory cells in the memory device; modifying a pattern of refresh operations for the portion of the memory cells based on the ECC operation; and performing a refresh operation on the portion of the memory cells based on the modified pattern of refresh operations. In some cases, the method includes identifying an error count based on the ECC operation; determining that the error count is equal to or greater than a threshold value; and increasing a number of refresh operations for the portion of the memory cells, where modifying the pattern of refresh operations is based on the increased number of refresh operations.

Figure 20:
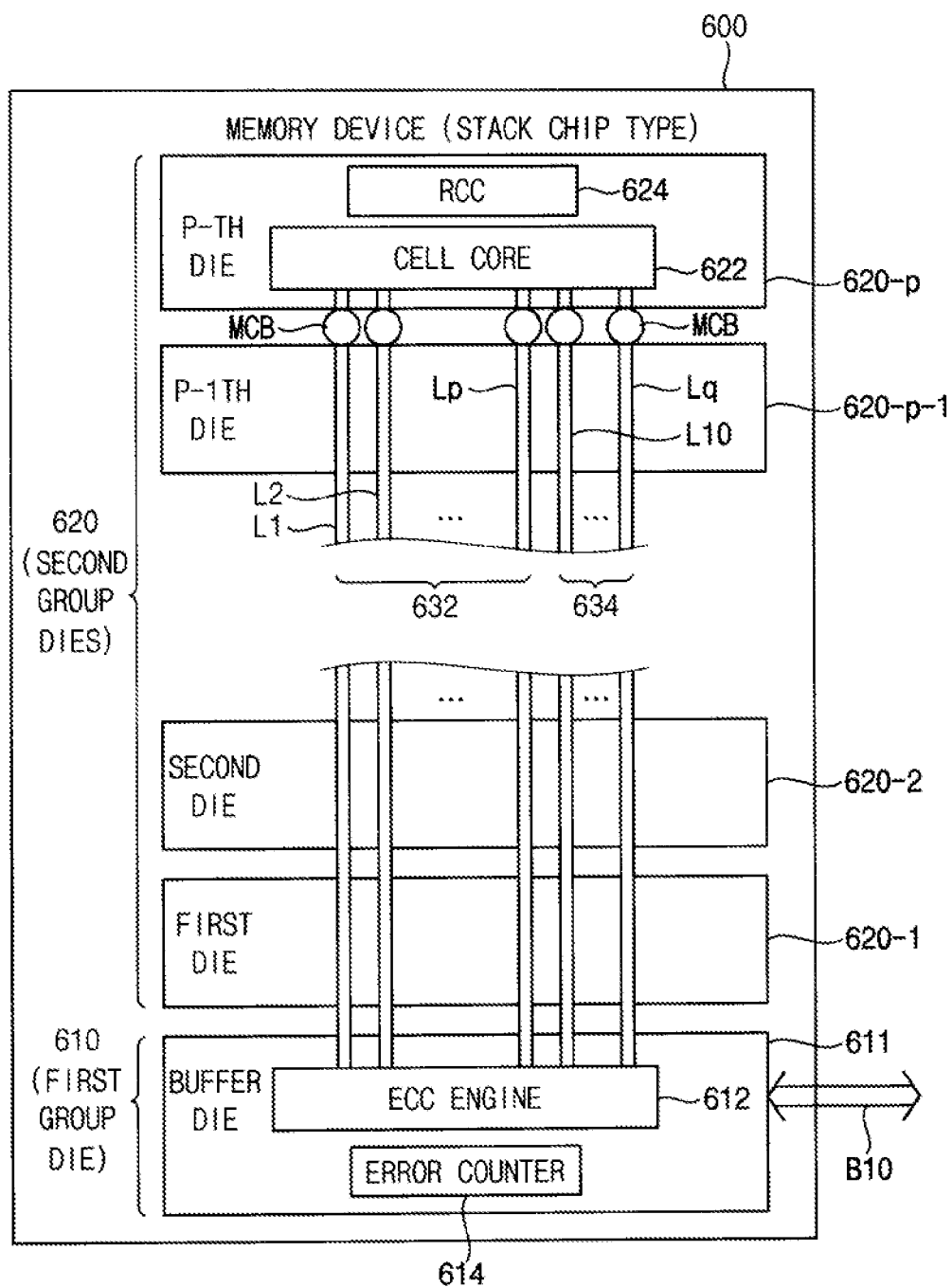
FIG. 20 is a block diagram illustrating a semiconductor memory device according to example embodiments.

FIG. 20 is a block diagram illustrating a semiconductor memory device according to example embodiments.

Referring to FIG. 20, a semiconductor memory device 600 may include a first group of buffer die 610 and a second group of memory die 620 providing a soft error analyzing and correcting function in a stacked chip structure.

The first group of dies 610 may include at least one buffer or logic die 611. The second group of dies 620 may include a plurality of memory dies 620-1 to 620-*p* which is stacked on the buffer die 611 and conveys data through a plurality of through substrate via lines, for example, through silicon via (TSV) lines. Each of the memory dies 620-1 to 620-*p* may include a cell core 622 that includes a memory cell array including a plurality of memory cell rows. Each of the memory cell rows includes a plurality of memory cells coupled to a word-line and a plurality of bit-lines. Additionally or alternatively, each of the memory dies 620-1 to 620-*p* may include a refresh control circuit 624 which performs a refresh operation on the plurality of memory cell rows. Additionally or alternatively, each of the memory die 620-1 to 620-*p* may include an ECC engine such as the ECC engine 400 of FIG. 17.

The buffer die 611 may include an ECC engine 612 which corrects a transmission error using the transmission parity bits when a transmission error is detected from the transmission data received through the TSV liens and generates error-corrected data and an error counter 614 that counts a number of error occurrences.

The refresh control circuit 624 may employ the refresh control circuit 500 of FIG. 5. Therefore, the semiconductor memory device 600 may increase a number of refresh operations performed on at least one memory cell row in which an error occurs.

The semiconductor memory device 600 may be a stack chip type memory device or a stacked memory device which conveys data and control signals through the TSV lines. The TSV lines may be also called 'through electrodes'.

A transmission error which occurs at the transmission data may be due to noise which occurs at the TSV lines. Since data-fail due to the noise occurring at the TSV lines may be distinguishable from data-fail due to a false operation of the memory die, data-fail may be regarded as soft data-fail (or a soft error). The soft data-fail may be generated due to transmission fail on a transmission path, and may be detected and remedied by an ECC operation.

For example, when the transmission data is 128-bit data, the transmission parity bits may be set to 8 bits. However, the scope and spirit of the inventive concepts are not limited thereto. The number of transmission parity bits increases or decreases.

With the above description, a data TSV line group 632 which is formed at one memory die 620-*p* may include 128 TSV lines L1 to L*p*, and a parity TSV line group 634 may include 8 TSV lines L10 to L*q*. The TSV lines L1 to L*p* of the data TSV line group 632 and the parity TSV lines L10 to L*q* of the parity TSV line group 634 may be connected to micro bumps MCB which are correspondingly formed among the memory dies 620-1 to 620-*p*.

At least one of the memory dies 620-1 to 620-*p* may include DRAM cells each including at least one access transistor and one storage capacitor.

The semiconductor memory device 600 may have a three-dimensional (3D) chip structure or a 2.5D chip structure to communicate with an external device through a data bus B10. The buffer die 610 may be connected with the memory controller 100 through the data bus B10.

Figure 21:
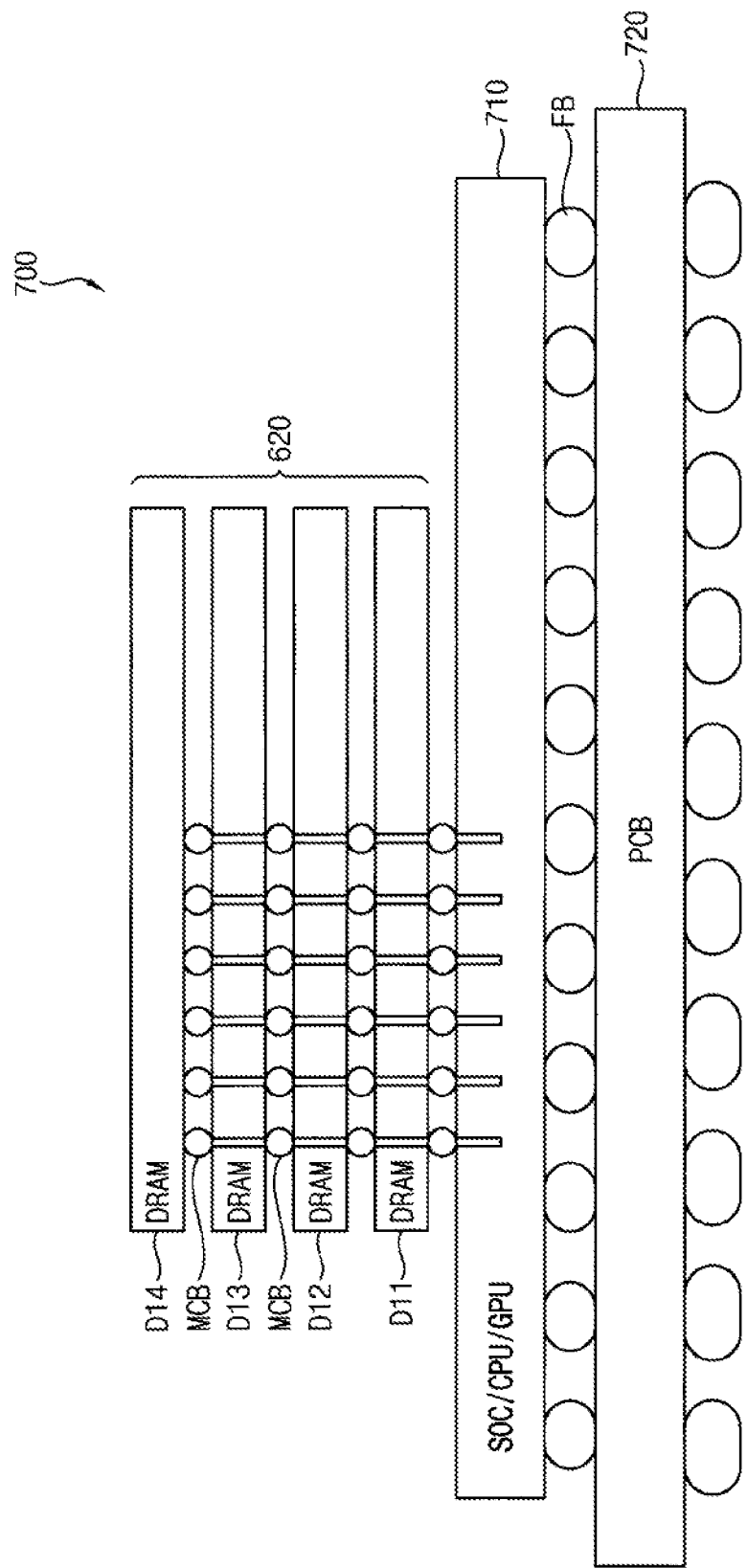
FIG. 21 is a cross-sectional view of a 3D chip structure employing the semiconductor memory device of FIG. 20 according to example embodiments

FIG. 21 is a cross-sectional view of a 3D chip structure employing the semiconductor memory device of FIG. 20 according to example embodiments.

FIG. 21 shows a 3D chip structure 700 in which a host and an HBM are directly connected without an interposer layer.

Referring to FIG. 21, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 720 to implement a HBM 620 as the memory dies in FIG. 20.

In FIG. 21, the buffer die 610 or a logic die of FIG. 20 is omitted. However, the buffer die 610 or the logic die may be disposed between the memory die D11 and the host die 720. To implement the HBM (620) structure, TSV lines may be formed at the memory dies D11 and D14. The TSV lines may be electrically connected with micro bumps MCB placed between memory dies.

Figure 22:
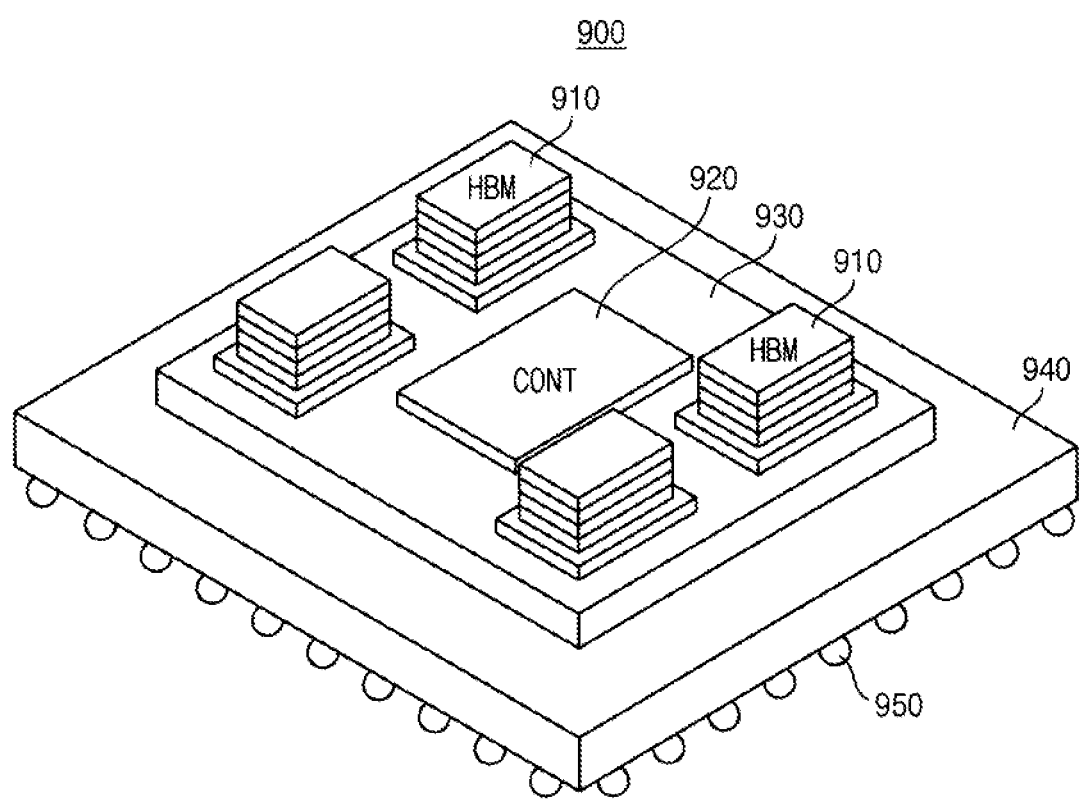
FIG. 22 is a diagram illustrating a semiconductor package including a stacked memory device according to example embodiments.

FIG. 22 is a diagram illustrating a semiconductor package including a stacked memory device according to example embodiments.

Referring to FIG. 22, a semiconductor package 900 may include one or more stacked memory devices 910 and a memory controller (CONT) 920.

The stacked memory devices 910 and the memory controller 920 may be mounted on an interposer 930, and the interposer on which the stacked memory devices 910 and the memory controller 920 are mounted may be mounted on a package substrate 940. The memory controller 920 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. The buffer die may include an ECC engine and an error information register and each of the memory dies may include a memory cell array and a refresh control circuit. Therefore, each of the stacked memory devices 910 may increase a number of refresh operations performed on some memory cell rows whose error occurrence count is equal to or greater than a threshold during a refresh period.

The plurality of stacked memory devices 910 may be mounted on the interposer 930, and the memory controller 920 may communicate with the plurality of stacked memory devices 910.

For example, each of the stacked memory devices 910 and the memory controller 920 may include a physical region, and communication may be performed between the stacked memory devices 910 and the memory controller 920 through the physical regions. Meanwhile, when each of the stacked memory devices 910 includes a direct access region, a test signal may be provided to each of the stacked memory devices 910 through conductive means (e.g., solder balls 950) mounted under package substrate 940 and the direct access region.

Aspects of the present inventive concept may be applied to systems using semiconductor memory devices that employ volatile memory cells, an ECC engine, and a refresh control circuit.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
a memory cell array including a plurality of memory cell rows, each of the plurality of memory cell rows including a plurality of volatile memory cells;
an error correction code (ECC) engine;
a refresh control circuit configured to perform a refresh operation on the plurality of memory cell rows; and
a control logic circuit configured to control the ECC engine based on a command and an address from an external memory controller,
wherein the control logic circuit is configured to control the ECC engine such that the ECC engine generates an error generation signal by performing an ECC decoding operation on sub-pages in at least one first memory cell row of the memory cell rows during a read operation,
wherein the control logic circuit is further configured to compare an error occurrence count of the first memory cell row with a threshold value and to provide the refresh control circuit with a first address of the first memory cell row as an error address based on the comparison, wherein the error occurrence count is generated based on the error generation signal, and
wherein the refresh control circuit is configured to increase a number of refresh operations performed in the first memory cell row during a refresh period based on the error occurrence count.

2. The semiconductor memory device of claim 1,
wherein the control logic circuit is configured to control the ECC engine such that the ECC engine performs the ECC decoding operation by reading data corresponding to a codeword from each of the sub-pages, detecting and correcting at least one error bit in the codeword, and outputting a corrected codeword.

3. The semiconductor memory device of claim 1, wherein the control logic circuit is configured provide the refresh control circuit with the first address as the error address in response to the error occurrence count associated with the sub-pages of the first memory cell row being equal to or greater than the threshold value.

4. The semiconductor memory device of claim 1, wherein when the refresh control circuit performs a normal refresh operation on the memory cell rows in response to the command during the refresh period, the refresh control circuit is configured to perform a weak refresh operation on one or more weak pages in parallel with the normal refresh operation on the memory cell rows cell rows during the refresh period, the one or more weak pages including the first memory cell row.

5. The semiconductor memory device of claim 4, wherein while the refresh control circuit is configured to perform the normal refresh operation on the memory cell rows during the refresh period, and to simultaneously refresh a corresponding weak page when the refresh control circuit refreshes a second memory cell row of the memory cell rows, the second memory cell row having a first page address which is equal to a weak page address from a set of weak page addresses of the one or more weak pages, except that a second page address differs from the weak page address by at least one bit.

6. The semiconductor memory device of claim 1, wherein when the refresh control circuit is configured to perform a normal refresh operation on the memory cell rows during the refresh period, and to performs a weak refresh operation on one or more weak pages including the first memory cell row after the normal refresh operation on the memory cell rows is completed.

7. The semiconductor memory device of claim 6, wherein the refresh control circuit is configured to decrease a refresh interval of the semiconductor memory device, to perform the normal refresh operation during a first sub interval of the refresh period, and to perform the weak refresh operation during a second sub interval of the refresh period, the second sub interval succeeding to the first sub interval.

8. The semiconductor memory device of claim 1, wherein the refresh control circuit includes:
   a refresh clock generator configured to generate a refresh clock signal based on a first refresh control signal, a second refresh control signal and a mode signal;
   a refresh counter configured to generate a counting address for sequentially refreshing the memory cell rows in response to the refresh clock signal, and to output a done signal upon generating a maximum counting address;
   a weak page address generator configured to store weak page addresses of one or more weak pages from among the plurality of memory cell rows and to store the error address as one of the weak page addresses, the weak page address generator being further configured to output the weak page addresses in response to the refresh clock signal, each of the one or more weak pages including at least one weak cell whose data retention time is smaller than normal cells;
   an address comparing circuit configured to compare the counting address with each of the weak page addresses to output a first match signal and a second match signal;
   a control signal generator configured to generate a plurality of control signals based on the first refresh control signal, the second refresh control signal, the mode signal, the done signal the first match signal and the second match signal;
   an address converter configured to generate a changed refresh row address by do-not-care processing at least one bit of the counting address, in response to a third control signal of the plurality of control signals; and
   a refresh address output circuit configured to output one of the counting address, the weak page address and the changed refresh row address as a refresh row address according to a refresh mode, based on a first control signal and a second control signal of the plurality of control signals.

9. The semiconductor memory device of claim 8, wherein the refresh address output circuit includes:
   a first multiplexer configured to select one of the counting address and the weak page address in response to the first control signal; and
   a second multiplexer configured to select one of the changed refresh row address and an output of the first multiplexer to output the refresh row address in response to the second control signal.

10. The semiconductor memory device of claim 8, wherein the control signal generator is configured to output the second control signal and the third control signal with a second logic level when the first refresh control signal indicates one of an auto-refresh operation and a self-refresh operation on the memory cell rows and the mode signal indicates a parallel mode of a weak refresh operation on the one or more weak pages; or
   to output the second control signal and the first controls signal with a first logic level and a second logic level respectively, and to transit the first control signal to a first logic level in response to the done signal transitioning to a first logic level when the first refresh control signal indicates one of an auto-refresh operation and a self-refresh operation on the memory cell rows and the mode signal indicates a sequential mode of the weak refresh operation on the one or more weak pages.

11. The semiconductor memory device of claim 8, wherein the control signal generator is configured to output the first control signal and the second control signal with a first logic level when the second refresh control signal indicates a weak refresh operation on the one or more weak pages.

12. The semiconductor memory device of claim 1, wherein the ECC engine includes:
   an ECC encoder configured to perform ECC encoding on data to be stored in the memory cell array to generate parity bits; and
   an ECC decoder configured to read data and the parity bits corresponding to a codeword from each of the sub-pages and to perform the ECC decoding operation on the data based on the parity bits.

13. The semiconductor memory device of claim 12, wherein the ECC decoder includes:
   a syndrome generation circuit configured to generate a syndrome based on the data and the parity bits;
   an error locator configured to generate the error generation signal and an error position signal indicating a position of at least one error bit in the data based on the syndrome; and
   a data corrector configured to receive the data, to correct the at least one error bit based in the error position signal and to output a corrected data.

14. The semiconductor memory device of claim 1, further comprising:
   an information register,
   wherein the control logic circuit is further configured to record error information in the error information register during the read operation and is to provide the error register to the refresh control circuit by referring to the error information, and
   wherein the error information at least includes a number of error occurrences in the plurality of memory cell rows.

15. The semiconductor memory device of claim 14, wherein the control logic circuit is configured to transfer the error information of the memory cell rows, which is recorded in the error information, to the memory controller as an error information signal.

16. The semiconductor memory device of claim 1, further comprising:
   at least one buffer die; and
   a plurality of memory dies, the plurality of memory dies stacked on the at least one buffer die and configured to convey data through a plurality of through silicon via (TSV) lines,
   wherein each of the plurality of memory dies includes the refresh control circuit and a memory core including the memory cell array, and
   wherein the at least one buffer die includes the ECC engine.

17. The semiconductor memory device of claim 16, wherein the at least one buffer die is configured to communicate with the memory controller.

18. A semiconductor memory device comprising:
   a memory cell array including a plurality of memory cell rows, each of the plurality of memory cell rows including a plurality of volatile memory cells;

an error correction code (ECC) engine;
a refresh control circuit configured to perform a refresh operation on the plurality of memory cell rows;
an error information register; and
a control logic circuit configured to control the ECC engine based on a command and an address from an external memory controller,
wherein the control logic circuit is configured to control the ECC engine such that the ECC engine generates an error generation signal by performing an ECC decoding operation on sub-pages in at least one first memory cell row of the memory cell rows during a read operation,
wherein the control logic circuit is further configured to either compare error occurrence count of the first memory cell row with a threshold value and to provide the refresh control circuit with a first address of the first memory cell row as an error address based on the comparison, the error occurrence count being generated based on the error generation signal, or
to record error information in the error information register during the read operation and is to provide the error address to the refresh control circuit by referring to the error information register,
wherein the error information at least includes a number of error occurrences in the first memory cell row and a second memory cell row, and
wherein the refresh control circuit is further configured to increase a number of refresh operations performed in the first memory cell row during a refresh period.

19. The semiconductor memory device of claim 18, wherein when the refresh control circuit is further configured to perform a normal refresh operation on the memory cell rows during the refresh period, and to perform a weak refresh operation on one or more weak pages including the first memory cell row after the normal refresh operation on the memory cell rows is completed, and
wherein the refresh control circuit is further configured to decrease a refresh interval of the semiconductor memory device, and to perform the normal refresh operation during a first sub interval of the refresh period and configured to perform the weak refresh operation during a second sub interval of the refresh period, the second sub interval succeeding to the first sub interval.

20. A method of operating a semiconductor memory device including a memory cell array, wherein the memory cell array includes a plurality of memory cell rows and each of the plurality of memory cell rows includes a plurality of volatile memory cells, the method comprising:
performing, by an error correction code (ECC) engine, an ECC decoding operation on sub-pages in at least one first memory cell row of the memory cell rows during a read operation;
counting, by a control logic circuit, an error occurrence of the at least one first memory cell row based on a result of the ECC decoding operation;
comparing, by the control logic circuit, the error occurrence count of the first memory cell row with a threshold value to provide a refresh control circuit with a first address of the first memory cell row as an error address in response to the error occurrence count being equal to or greater that the threshold value; and
increasing, by the refresh control circuit, a number of refresh operations performed on the first memory cell row during a refresh period.

* * * * *